(12) United States Patent
Park

(10) Patent No.: US 8,008,167 B2
(45) Date of Patent: Aug. 30, 2011

(54) PHASE CHANGE MEMORY DEVICE HAVING AN INCREASED SENSING MARGIN FOR CELL EFFICIENCY AND METHOD FOR MANUFACTURING THE SAME

(75) Inventor: Hae Chan Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 184 days.

(21) Appl. No.: 12/436,515

(22) Filed: May 6, 2009

(65) Prior Publication Data

US 2010/0127234 A1 May 27, 2010

(30) Foreign Application Priority Data

Nov. 21, 2008 (KR) .................. 10-2008-0116373

(51) Int. Cl.
*H01L 21/20* (2006.01)
*H01L 45/00* (2006.01)
(52) U.S. Cl. ............... 438/478; 257/4; 257/E45.002; 257/E21.09
(58) Field of Classification Search ....... 257/4, E45.002, 257/E21.09; 365/4, 63, 163, 230.06; 438/478
See application file for complete search history.

(56) References Cited

U.S. PATENT DOCUMENTS

| | | | |
|---|---|---|---|
| 2005/0158950 A1* | 7/2005 | Scheuerlein et al. | 438/257 |
| 2009/0052231 A1* | 2/2009 | Kurotsuchi et al. | 365/163 |
| 2009/0316473 A1* | 12/2009 | Happ et al. | 365/163 |

FOREIGN PATENT DOCUMENTS

| | | |
|---|---|---|
| KR | 10-0621774 B1 | 9/2006 |
| KR | 1020080039701 A | 5/2008 |

\* cited by examiner

*Primary Examiner* — Matthew W Such
*Assistant Examiner* — Monica D Harrison
(74) *Attorney, Agent, or Firm* — Ladas & Parry LLP

(57) ABSTRACT

A phase change memory device having an increased sensing margin for improved cell efficiency. The phase change memory device includes a plurality of diodes formed in an active region of a semiconductor substrate; an insulation layer pattern formed on the respective diodes; a phase change layer formed on the insulation layer pattern in such a way as not to be electrically connected with the diodes; bit lines formed over the phase change layer; and a global X-decoder line formed over the bit lines. The present invention suppresses current flow in a phase change memory device because the dummy cell string and the dummy active region are not electrically connected with each other under the global X-decoder line, whereby preventing parasitic current from being produced in the phase change memory device.

10 Claims, 31 Drawing Sheets

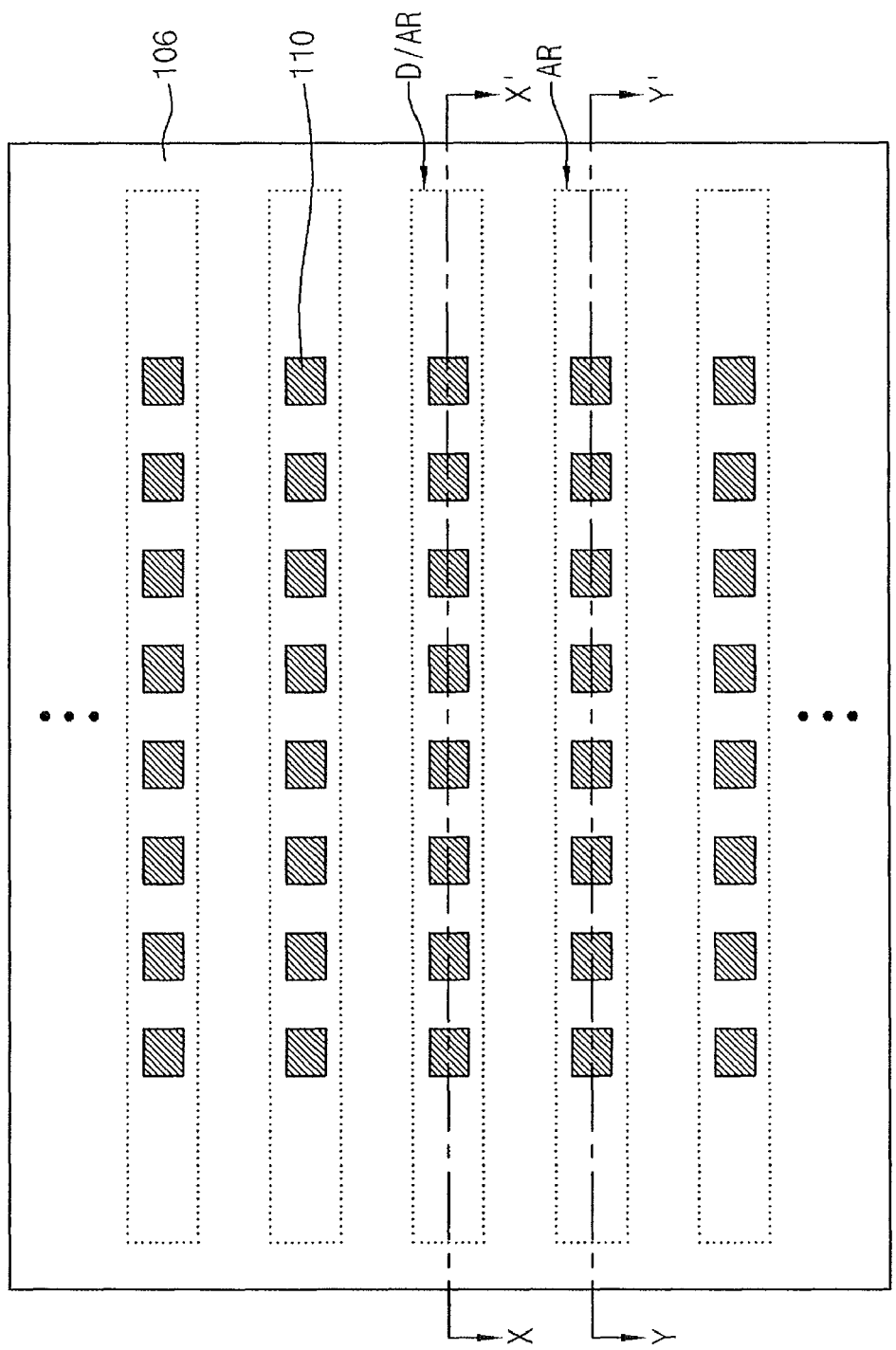

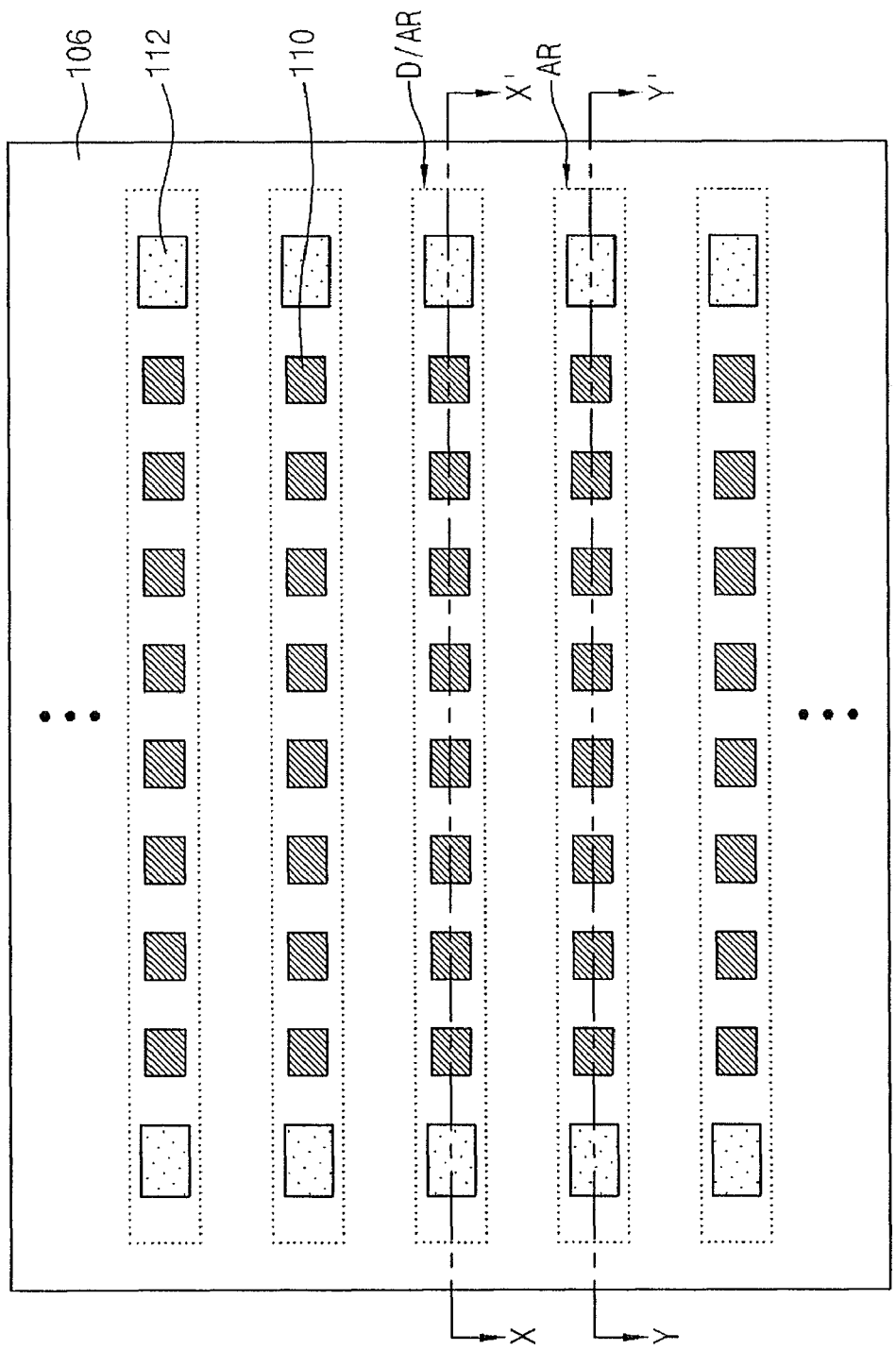

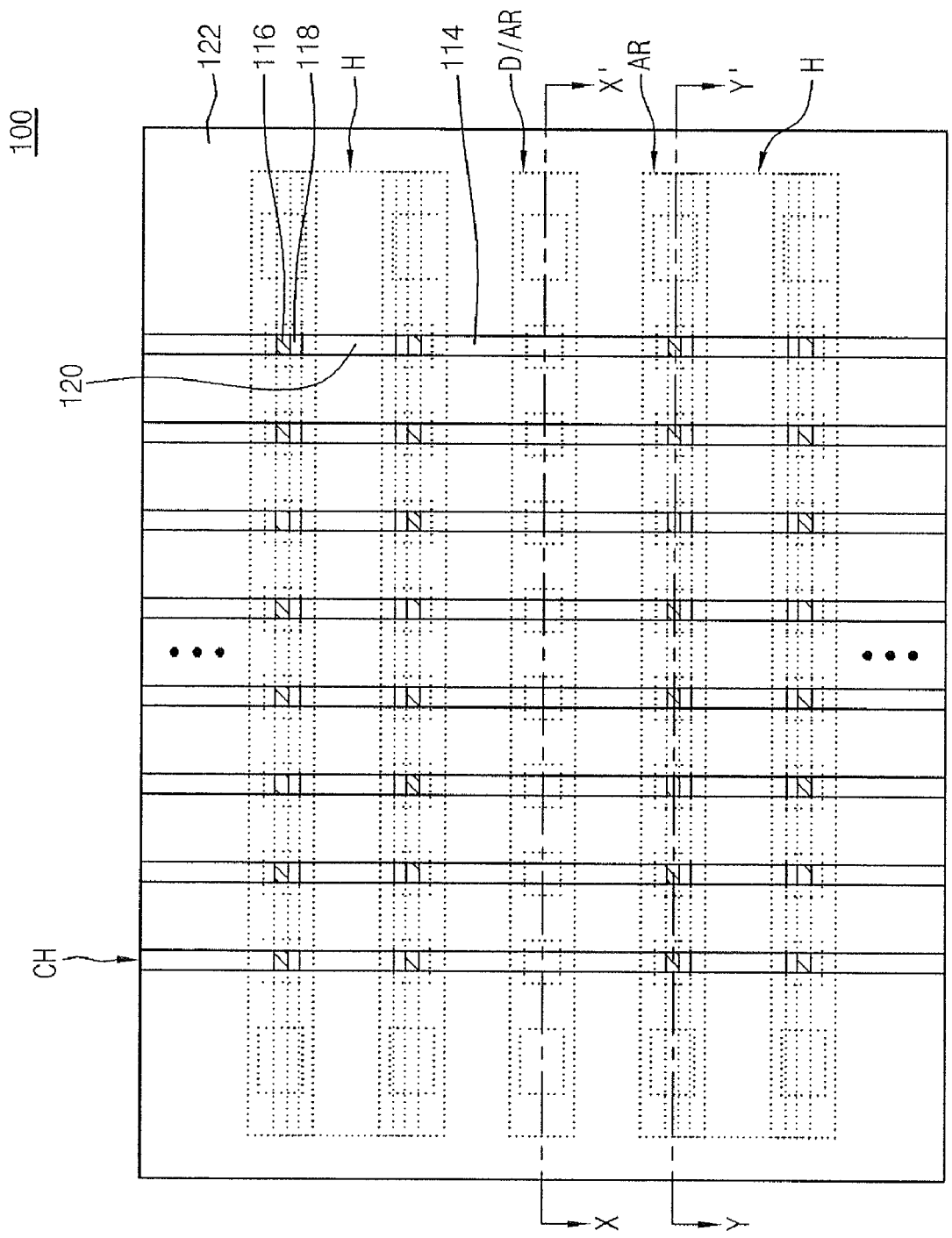

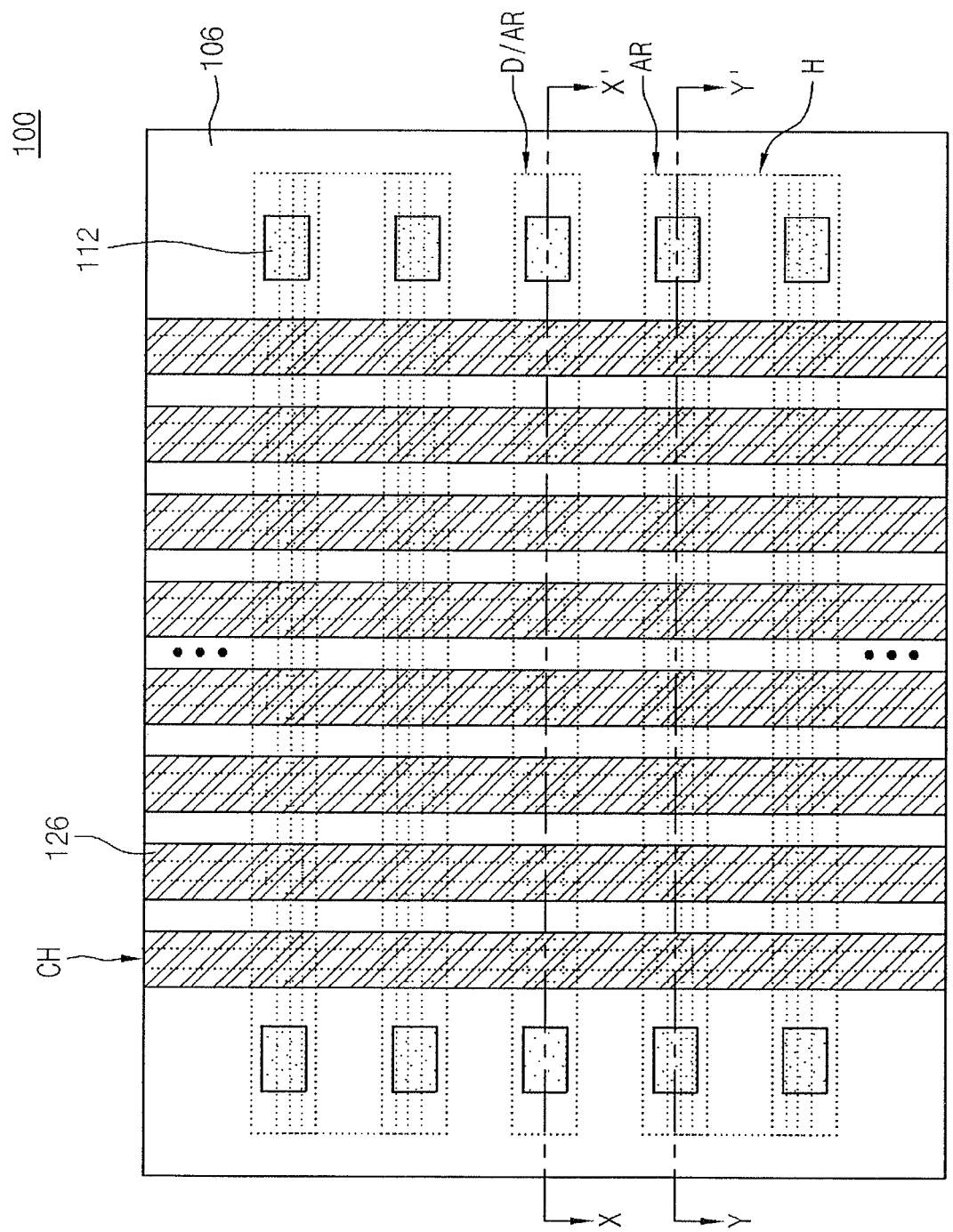

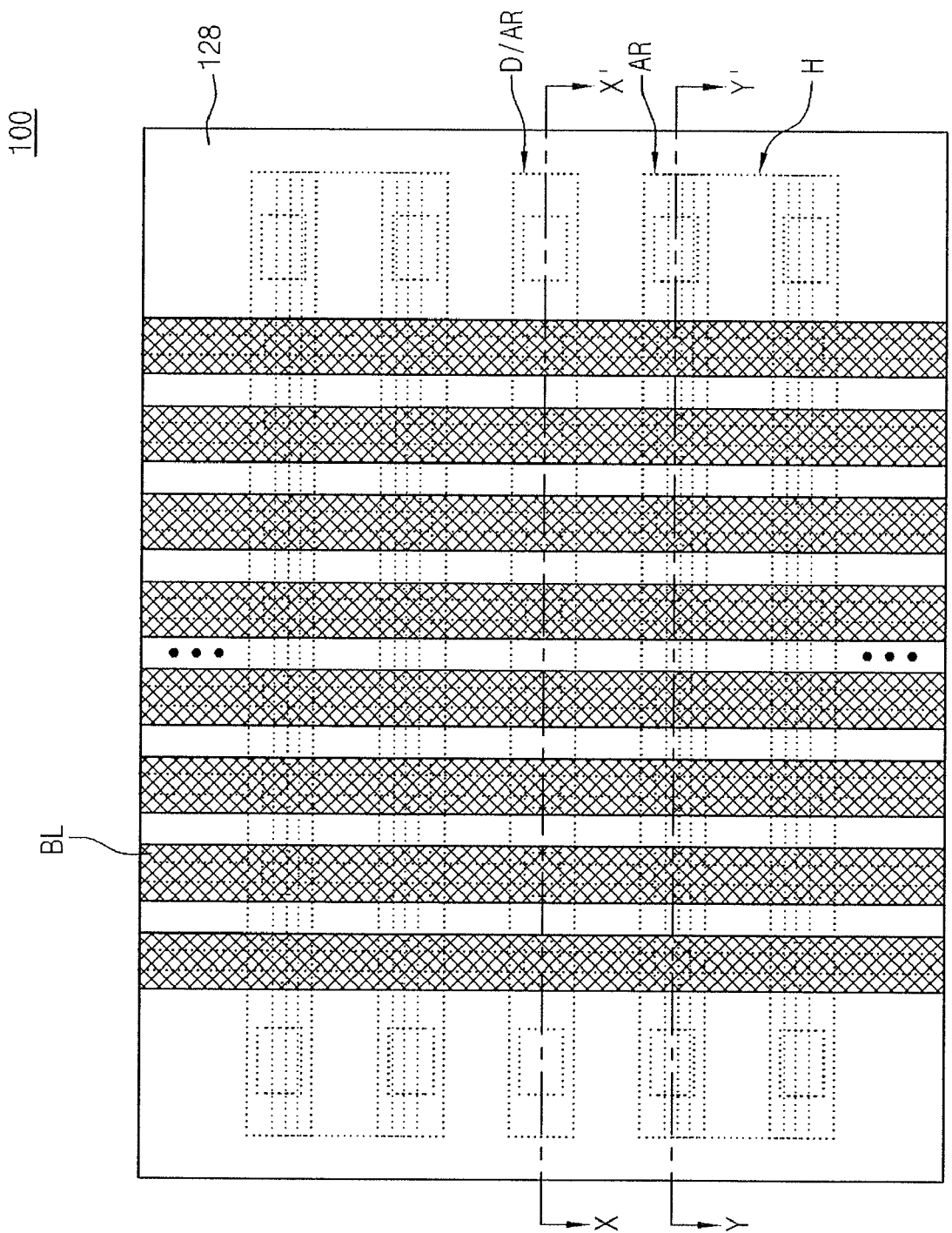

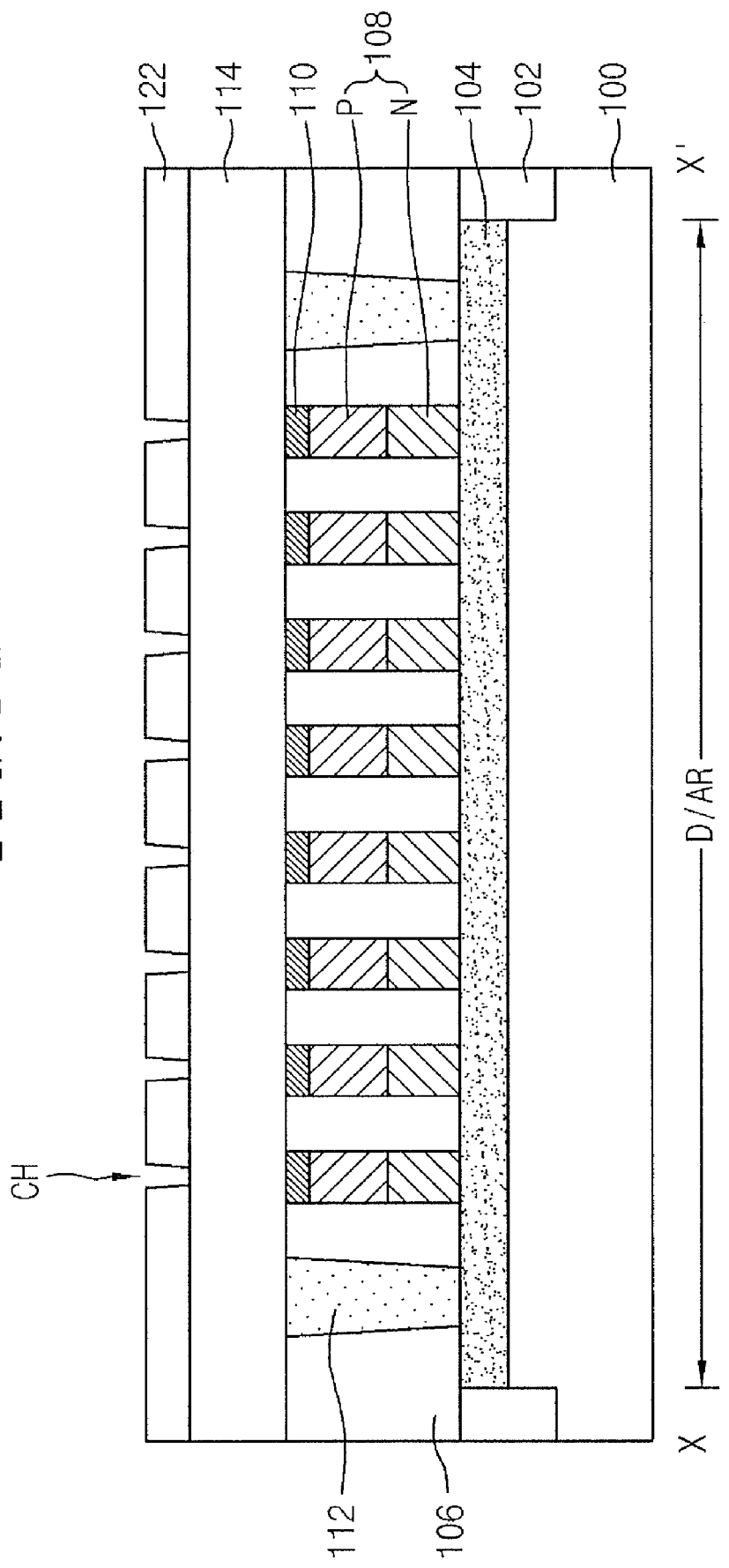

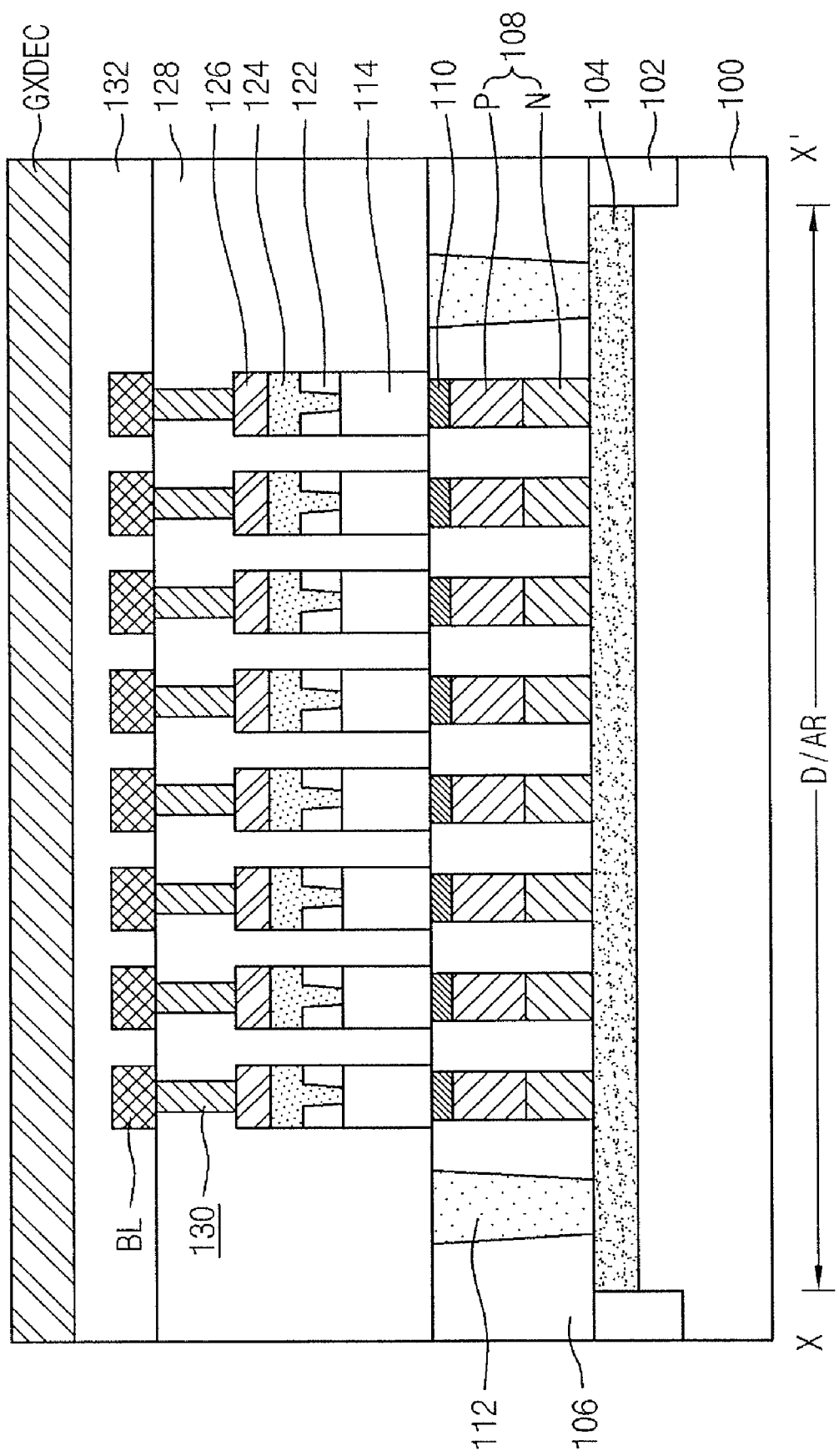

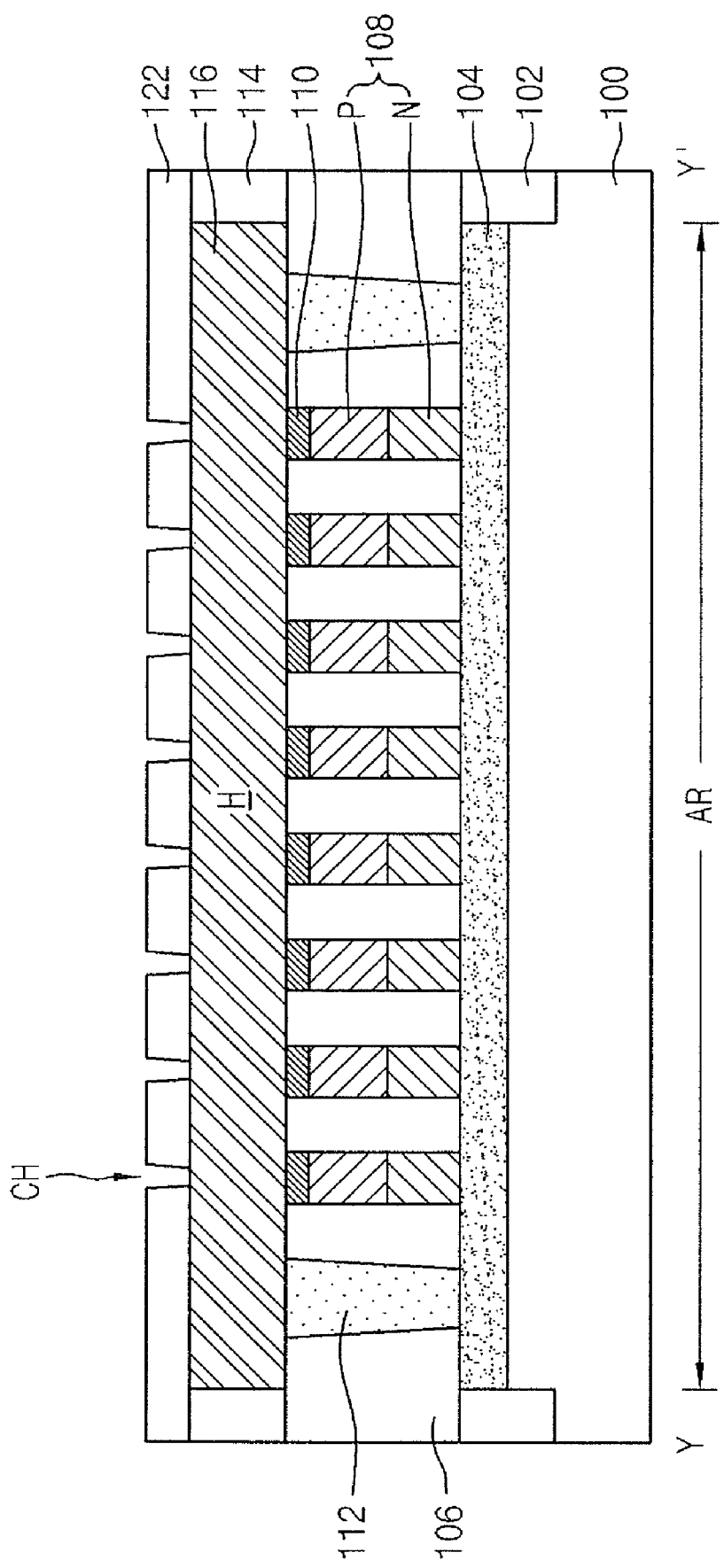

PHASE CHANGE MEMORY DEVICE HAVING AN INCREASED SENSING MARGIN FOR CELL EFFICIENCY AND METHOD FOR MANUFACTURING THE SAME

CROSS-REFERENCE TO RELATED APPLICATIONS

The present application claims priority to Korean patent application number 10-2008-0116373 filed on Nov. 21, 2008, which is incorporated herein by reference in its entirety.

BACKGROUND OF THE INVENTION

The present invention relates generally to a phase change memory device and a method for manufacturing the same, and more particularly, to a phase change memory device having an increased sensing margin and improved cell efficiency and a method for manufacturing the same.

In general, when configuring the memory cells of a phase change memory device, cell arrays are constructed by repeatedly locating memory cell strings, wherein each of these memory cell strings includes a plurality of diodes that include an epi-silicon layer. That is, in one cell array, 8-bit memory cell strings are located in a word line direction, and 8-bit memory cell strings as well as a global X-decoder line that is connected to a global X-decoder can be located in a bit line direction.

Here, since the global X-decoder line is used for transmitting an applied bias to the gate of a local switch transistor that is positioned between memory cell arrays, the global X-decoder line is not connected to the memory cells that are located in the cell array. Also, dummy cells are formed under the global X-decoder line to define process conditions similar to those for the memory cells.

Hereinafter, a conventional phase change memory device including a global X-decoder line will be briefly described.

A global X-decoder line indicates a line that transmits a signal for selecting a word line, which is outputted from a global X-decoder. Since the global X-decoder line is formed as a layer over bit lines, that is, the same layer as word lines, a dummy cell string having the same structure as 8-bit memory cell strings is formed under the global X-decoder line so as to define process conditions similar to those for the memory cells. In other words, dummy cells are formed under the global X-decoder line. This dummy cell, which is similar to the memory cell, includes a bottom electrode contact, a phase change layer, a top electrode, a top electrode contact, and a bit line. Lower contact plugs are formed in an active region on both sides of the dummy cell string, but upper contact plugs are not formed so as to prevent the electrical connection between the global X-decoder line and the dummy cell string. The active region under the global X-decoder line is in a grounded state (Vss).

However, in the conventional art described above, because the dummy cell string formed under the global X-decoder line is electrically connected to bit lines similar to other memory cell strings, when data is read in the phase change memory device, parasitic current is generated.

In detail, in the conventional art described above, when data is read in the phase change memory device, if one bit line is selected, a preset voltage (in general, a boosted voltage Vpp) is supplied to the selected bit line, and data is accessed to a memory cell. At this time, since the active region under the global X-decoder line is in the grounded state (Vss), current flows from the bit line to the active region via the dummy cell that is electrically connected to the selected bit line, whereby parasitic current is generated.

As a consequence, in the conventional art described above, the parasitic current can influence the state of data when the phase change memory device changes a phase. Therefore, this parasitic current causes a sense amplifier to improperly operate for sensing and amplifying the data, which makes it difficult to discriminate data from a "1" or "0", whereby a sensing margin decreases.

In order to suppress the generation of parasitic current, a method of applying a boosted voltage Vpp to the active region under the global X-decoder line has been proposed so that the same conditions as non-selected word lines can be created. Nevertheless, in this case, in order to apply the boosted voltage Vpp to the active region, additional dummy lines should be formed in the peripheral portions of a cell array, whereby the area of the cell array increases and cell efficiency decreases.

SUMMARY OF THE INVENTION

Embodiments of the present invention are directed to a phase change memory device that increases a sensing margin and a method for manufacturing the same.

Also, embodiments of the present invention are directed to a phase change memory device that improves cell efficiency and a method for manufacturing the same.

In one aspect of the present invention, a phase change memory device comprises a plurality of diodes formed in an active region of a semiconductor substrate; an insulation layer pattern formed on the respective diodes; a phase change layer formed on the insulation layer pattern in such a way as not to be electrically connected with the diodes; bit lines formed over the phase change layer; and a global X-decoder line formed over the bit lines.

The phase change memory device further comprises an N-type impurity region formed in a surface of the active region.

A ground voltage is applied to the active region.

The diodes comprise vertical PN diodes.

The phase change memory device further comprises an ohmic contact layer formed on the diodes.

The phase change memory device further comprises top electrodes formed between the phase change layer and the bit lines.

The global X-decoder line is not electrically connected with the active region.

In another aspect of the present invention, a method for manufacturing a phase change memory device comprises the steps of forming a plurality of diodes in an active region of a semiconductor substrate; forming an insulation layer pattern on the respective diodes; forming a phase change layer on the insulation layer pattern in such a way as not to be electrically connected with the diodes; forming bit lines over the phase change layer; and forming a global X-decoder line over the bit lines.

Before the step of forming the diodes, the method further comprises the step of forming an N-type impurity region in a surface of the active region.

A ground voltage is applied to the active region.

The diodes comprise vertical PN diodes.

After the step of forming the diodes and before the step of forming the insulation layer pattern, the method further comprises the step of forming an ohmic contact layer on the diodes.

After the step of forming the phase change layer and before the step of forming the bit lines, the method further comprises the step of forming top electrodes on the phase change layer.

The global X-decoder line is not electrically connected with the active region.

In still another aspect of the present invention, a method for manufacturing a phase change memory device comprises the steps of forming a plurality of bar type cell active regions and a bar type dummy active region which is located between adjoining sets of cell active regions, in a semiconductor substrate; forming a plurality of diodes in the cell active regions and the dummy active region; forming an insulation layer pattern on the resultant semiconductor substrate which is formed with the diodes, such that the insulation layer pattern has holes each of which simultaneously exposes a portion between adjoining cell active regions and portions of the respective adjoining cell active regions adjacent to the portion, and covers the dummy active region; forming heaters in the holes in such a way as to contact the diodes in the cell active regions; forming a phase change layer on the heaters in the cell active regions and on the insulation layer pattern in the dummy active region; forming bit lines over the phase change layer; and forming word lines over the bit lines in the cell active regions and a global X-decoder line over the bit lines in the dummy active region.

One dummy active region is located for every eight cell active regions.

Before the step of forming the diodes, the method further comprises the step of forming N-type impurity regions in respective surfaces of the cell active regions and dummy active region.

A ground voltage is applied to the dummy active region.

The diodes comprise vertical PN diodes.

After the step of forming the diodes and before the step of forming the insulation layer pattern, the method further comprises the step of forming an ohmic contact layer on the diodes.

The heaters are formed on both sidewalls of the holes.

The phase change layer in the dummy active region is not electrically connected with the diodes in the dummy active region.

After the step of forming the phase change layer and before the step of forming the bit lines, the method further comprises the step of forming top electrodes on the phase change layer.

The word lines are electrically connected with the cell active regions.

The global X-decoder line is not electrically connected with the dummy active region.

BRIEF DESCRIPTION OF THE DRAWINGS

FIGS. 2A through 2J are plan views illustrating the processes of a method for manufacturing a phase change memory device in accordance with another embodiment of the present invention.

FIGS. 3A through 3J are cross-sectional views taken along the lines X-X' of FIGS. 2A through 2J, illustrating the processes of the method for manufacturing a phase change memory device in accordance with another embodiment of the present invention.

FIGS. 4A through 4J are cross-sectional views taken along the lines Y-Y' of FIGS. 2A through 2J, illustrating the processes of the method for manufacturing a phase change memory device in accordance with another embodiment of the present invention.

DESCRIPTION OF SPECIFIC EMBODIMENTS

Hereafter, specific embodiments of the present invention will be described in detail with reference to the accompanying drawings.

Figure 1:
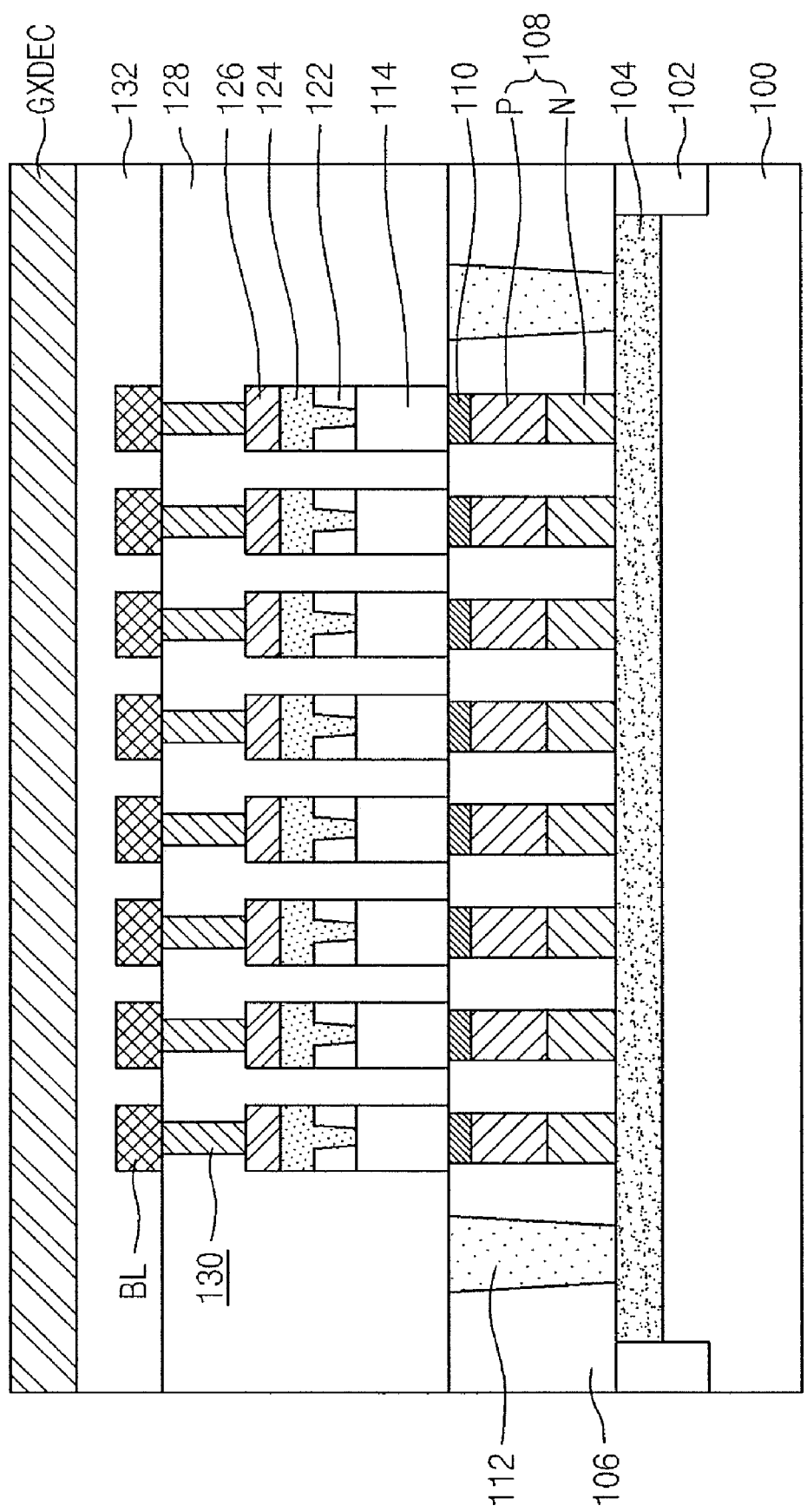
FIG. 1 is a cross-sectional view illustrating a phase change memory device in accordance with an embodiment of the present invention.

FIG. 1 is a sectional view illustrating a phase change memory device in accordance with an embodiment of the present invention.

Referring to FIG. 1, an isolation structure 102 is formed in a semiconductor substrate 100 to delimit an active region, and an N-type impurity region 104 is formed in the surface of the active region. A ground voltage is applied to the active region that is formed with the N-type impurity region 104. A first interlayer dielectric 106 is formed in the active region, and a plurality of diodes 108 are formed in the first interlayer dielectric 106 to be placed in the active region. The diodes 108 comprise vertical PN diodes, wherein each of the PN diodes includes an N region N and a P region P. Also, each of the PN diodes are sequentially stacked on the N-type impurity region 104. An ohmic contact layer 110 is formed on the respective diodes 108. The ohmic contact layer 110 includes, for example, a metal silicide layer. Lower contact plugs 112 are formed in the first interlayer dielectric 106.

An insulation layer pattern 114 is formed over the diodes 108 on which the ohmic contact layer 110 is formed. A phase change layer 124 and a top electrode 126 are sequentially formed on the insulation layer pattern 114. A third interlayer dielectric 128 is formed to cover the resultant semiconductor substrate 100 including the top electrodes 126, and top electrode contacts 130 are formed in the third interlayer dielectric 128 to contact top electrodes 126, respectively. Due to the fact that the insulation layer pattern 114 is formed between the phase change layer 124 and the diodes 108 and not heater, the phase change layer 124 and the diodes 108 are not electrically connected with each other because of the presence of the insulation layer pattern 114. The unexplained reference numeral 122 designates a second interlayer dielectric.

Bit lines BL are formed on the third interlayer dielectric 128 over the phase change layer 124 to contact the top electrode contacts 130. A fourth interlayer dielectric 132 is formed to cover the bit lines BL, and a global X-decoder line GXDEC is formed on the fourth interlayer dielectric 132 over the bit lines BL.

Because the global X-decoder line GXDEC is used for the transmitting an applied bias to the gate of a local switch transistor that is positioned between memory cell arrays, the global X-decoder line GXDEC is not connected with the memory cells which are placed in the cell arrays. Therefore, since upper contact plugs are not formed between the global X-decoder line GXDEC and the lower contact plugs 106, the global X-decoder line GXDEC is not electrically connected with the active region. The structure that is formed under the global X-decoder line GXDEC constitutes a dummy cell structure that is formed to create process conditions similar to those for memory cells.

The phase change memory device in accordance with the embodiment of the present invention includes the dummy cell structure that is placed under the global X-decoder line GXDEC. The dummy cell structure has a configuration such that the insulation layer pattern 114 is formed between the diodes 108 and the phase change layer 124 and not heaters. Thus, due to the presence of the insulation layer pattern 114, the diodes 108 and the phase change layer 124 are not electrically connected with each other, and wherein the bit lines BL of the dummy cell structure and the active region are also not electrically connected with each other.

As a consequence, in the present invention, current flow is suppressed from the bit line BL of a selected memory cell to the active region under the dummy cell structure, whereby the production of parasitic current is prevented. Thus, in the present invention, the sensing margin of the phase change memory device is increased.

Further, in the present invention, the formation of additional dummy lines in the peripheral portions of a cell array are not necessary to suppress current flow from the bit line BL of a selected memory cell to the active region under the dummy cell structure. Therefore, in the present invention, the area of a cell array is decreased, and cell efficiency is improved.

FIGS. 2A through 2J are plan views illustrating the processes of a method for manufacturing a phase change memory device in accordance with another embodiment of the present invention, and FIGS. 3A through 3J and FIGS. 4A through 4J are sectional views taken along the lines X-X' and Y-Y' of FIGS. 2A through 2J, illustrating the processes of the method for manufacturing a phase change memory device in accordance with another embodiment of the present invention.

Figure 2A:
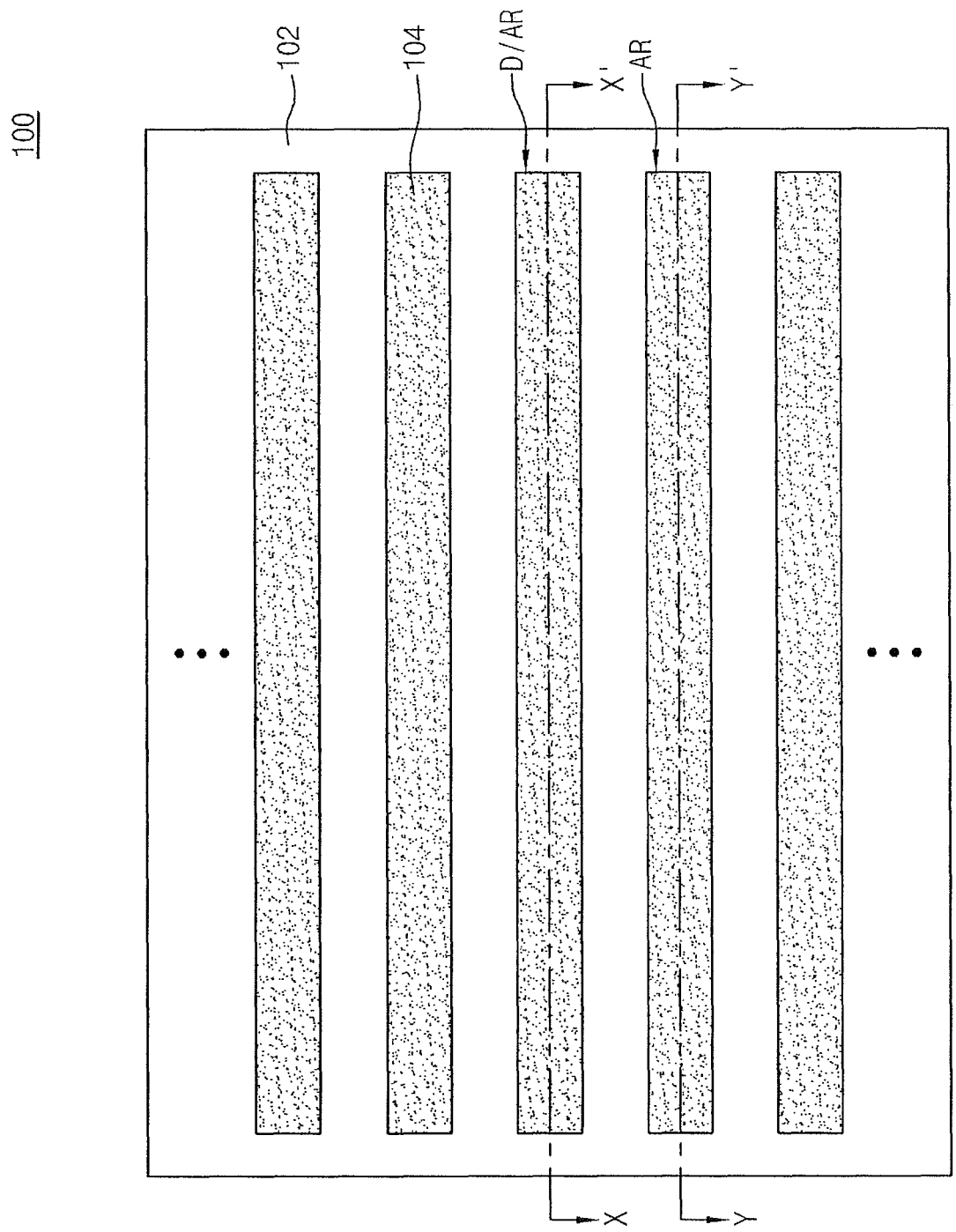
Figure 3A:
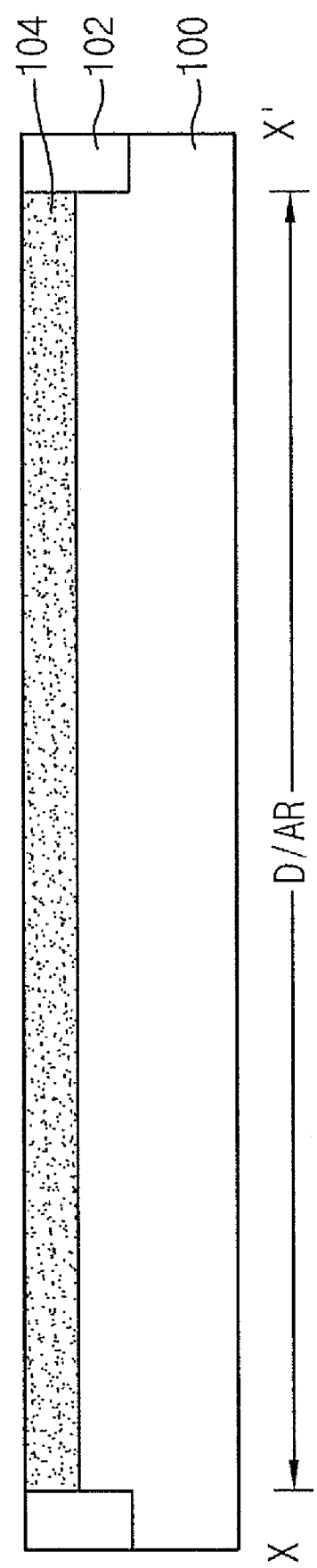
Figure 4A:
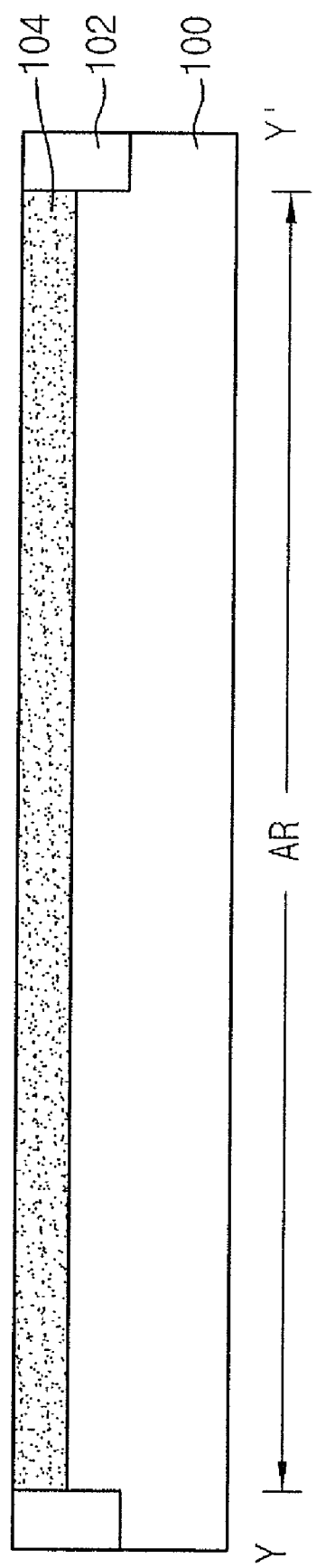

Referring to FIGS. 2A, 3A and 4A, an isolation structure 102 is formed in a semiconductor substrate 100 in such a way as to delimit a plurality of bar type cell active regions AR and a bar type dummy active region D/AR which is located between adjoining sets of cell active regions AR. For example, one dummy active region D/AR is located for every eight cell active regions AR. N-type impurity regions 104 are formed in the surfaces of the cell active regions AR and the dummy active region D/AR. The N-type impurity regions 104 are formed through, for example, an N-type ion-implantation process. A ground voltage is applied to the dummy active region D/AR which is formed with the N-type impurity region 104.

Figure 3B:
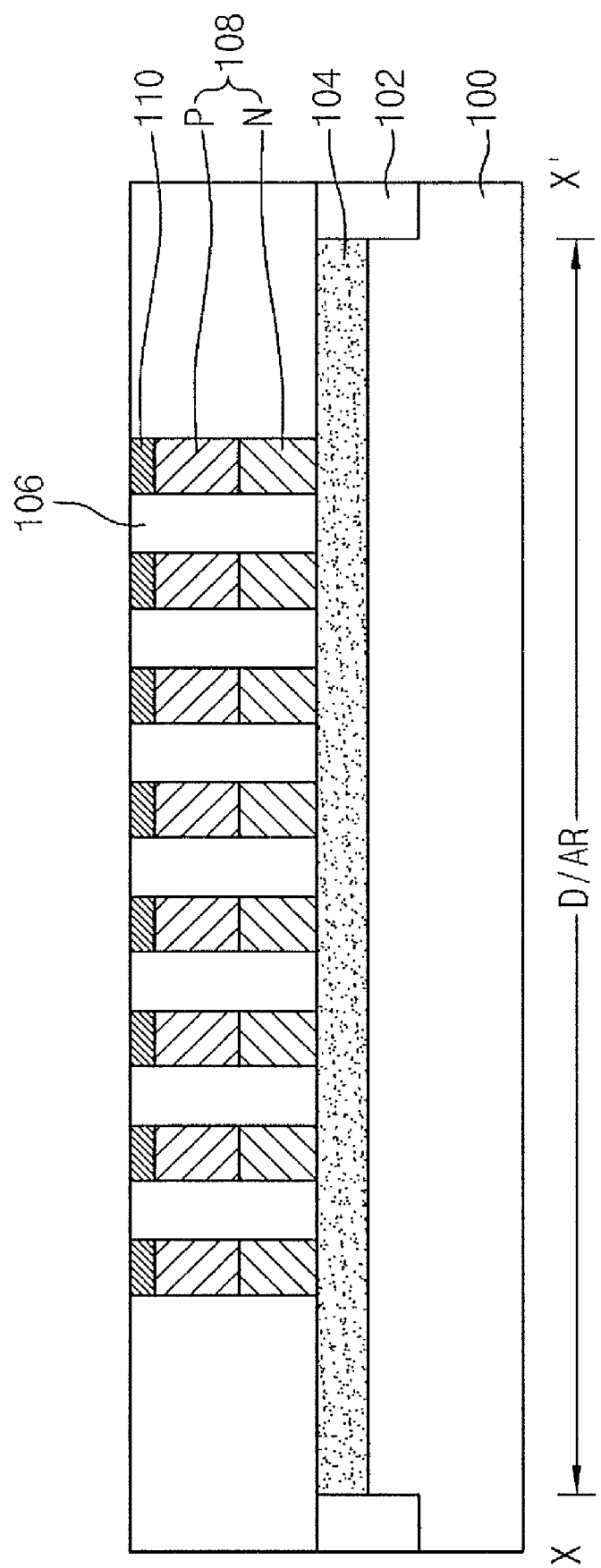
Figure 4B:
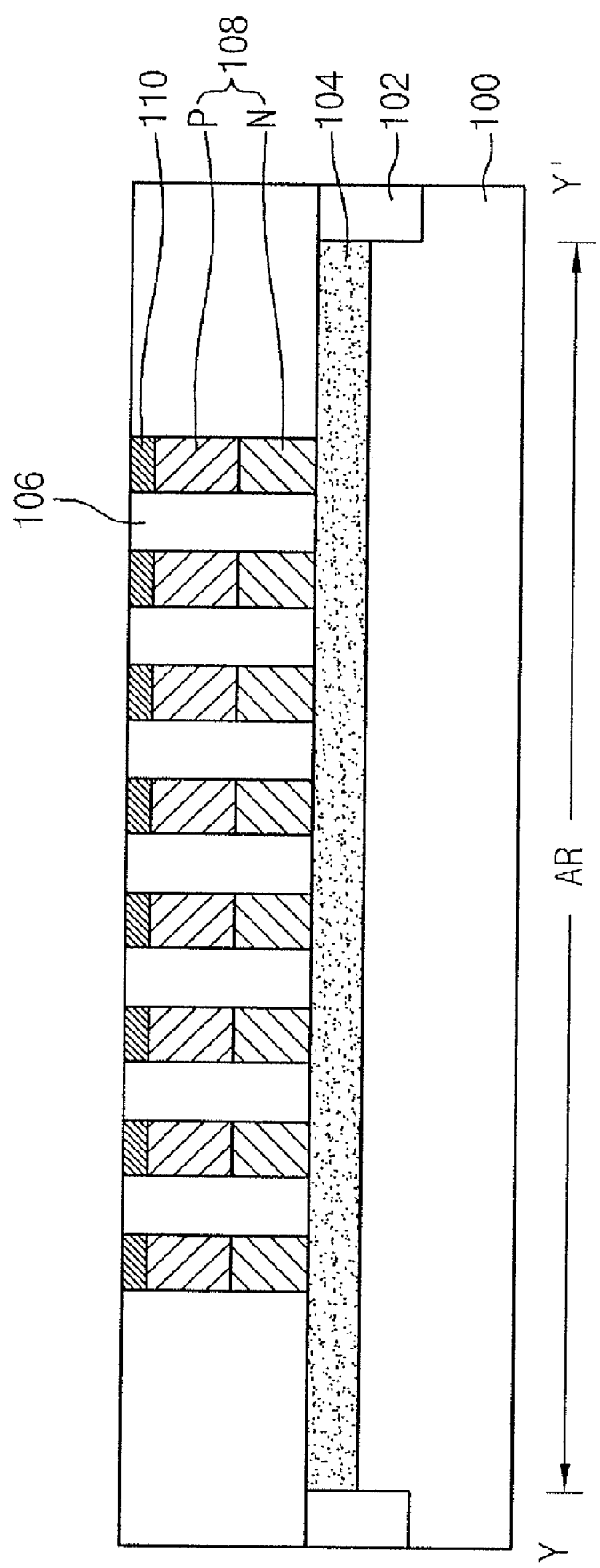

Referring to FIGS. 2B, 3B and 4B, a first interlayer dielectric 106 is formed on the resultant semiconductor substrate 100 which is formed with the N-type impurity regions 104. A plurality of diodes 108 are formed in the first interlayer dielectric 106 to be placed in the cell active regions AR and the dummy active region D/AR. The diodes 108 comprise vertical PN diodes which include an N region N and a P region P which are sequentially stacked on the N-type impurity regions 104. It is preferred that an ohmic contact layer 110 be formed on the diodes 108. The ohmic contact layer 110 comprises, for example, a metal silicide layer.

Figure 3C:
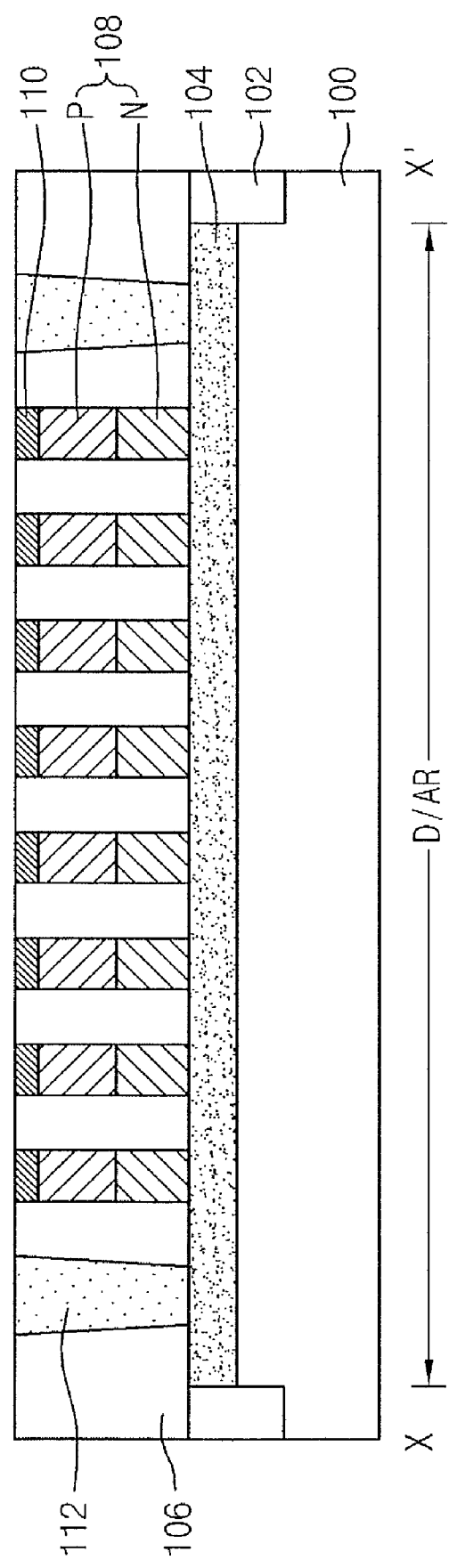
Figure 4C:
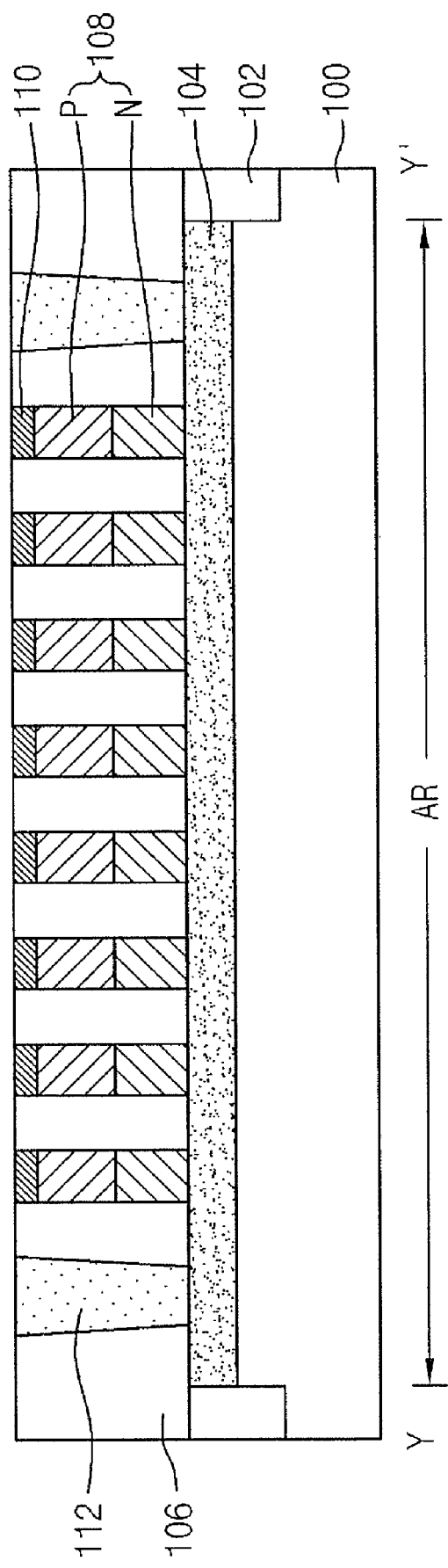

Referring to FIGS. 2C, 3C and 4C, lower contact plugs 112 are formed in the first interlayer dielectric 106 in such a way as to contact the N-type impurity regions 104. It can be envisaged that the lower contact plugs 112 can be formed before or at the same time the diodes 108 are formed.

Figure 2D:
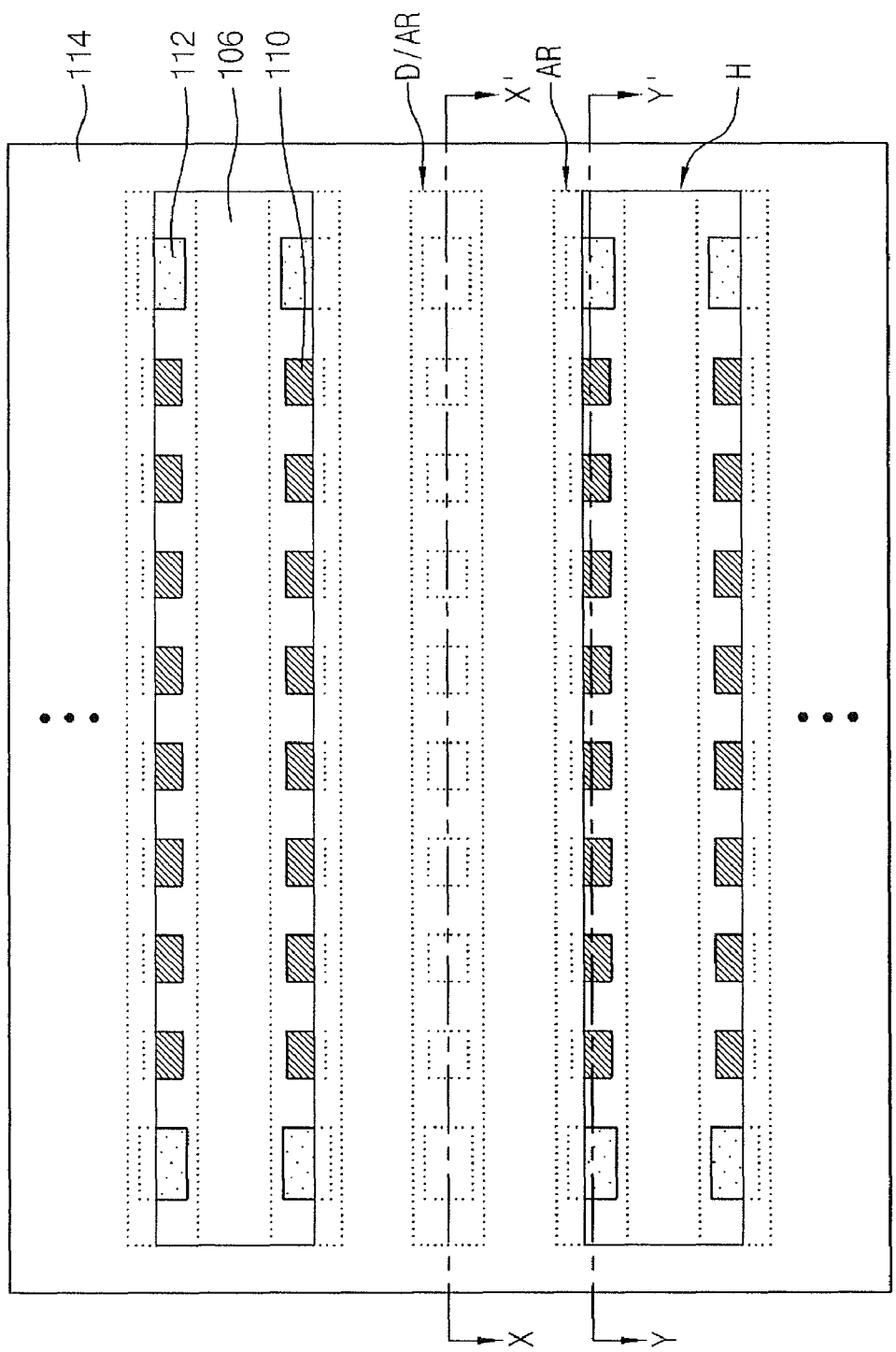
Figure 3D:
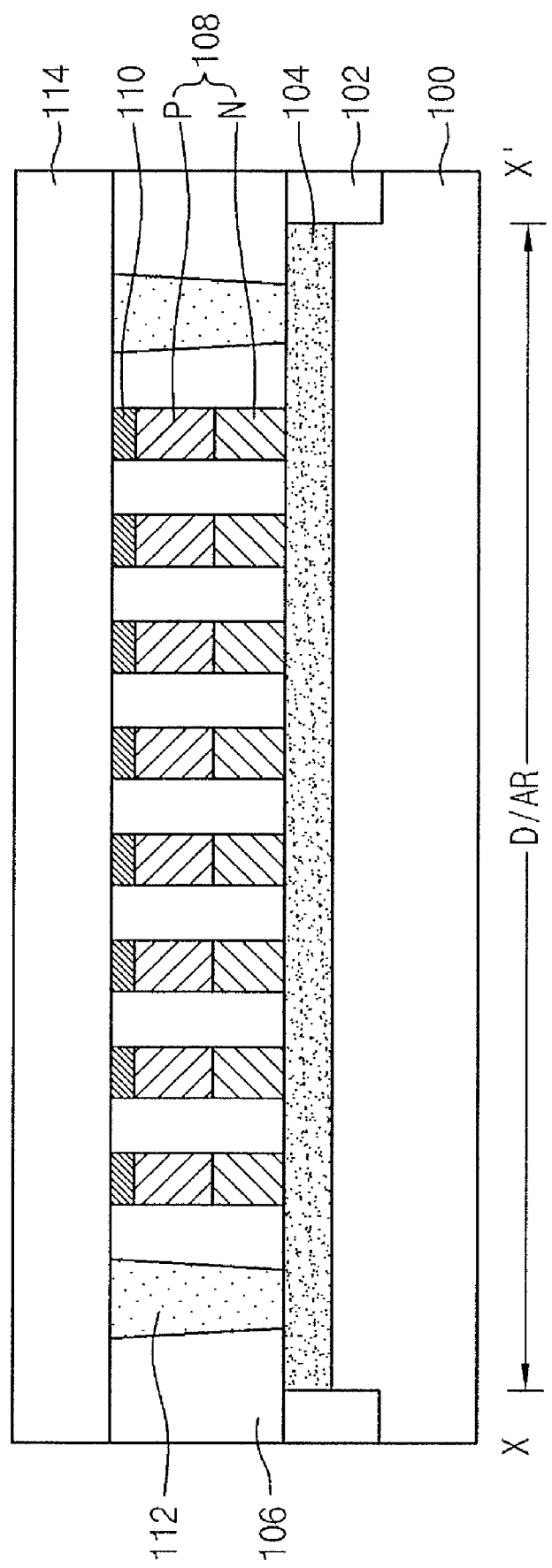
Figure 4D:
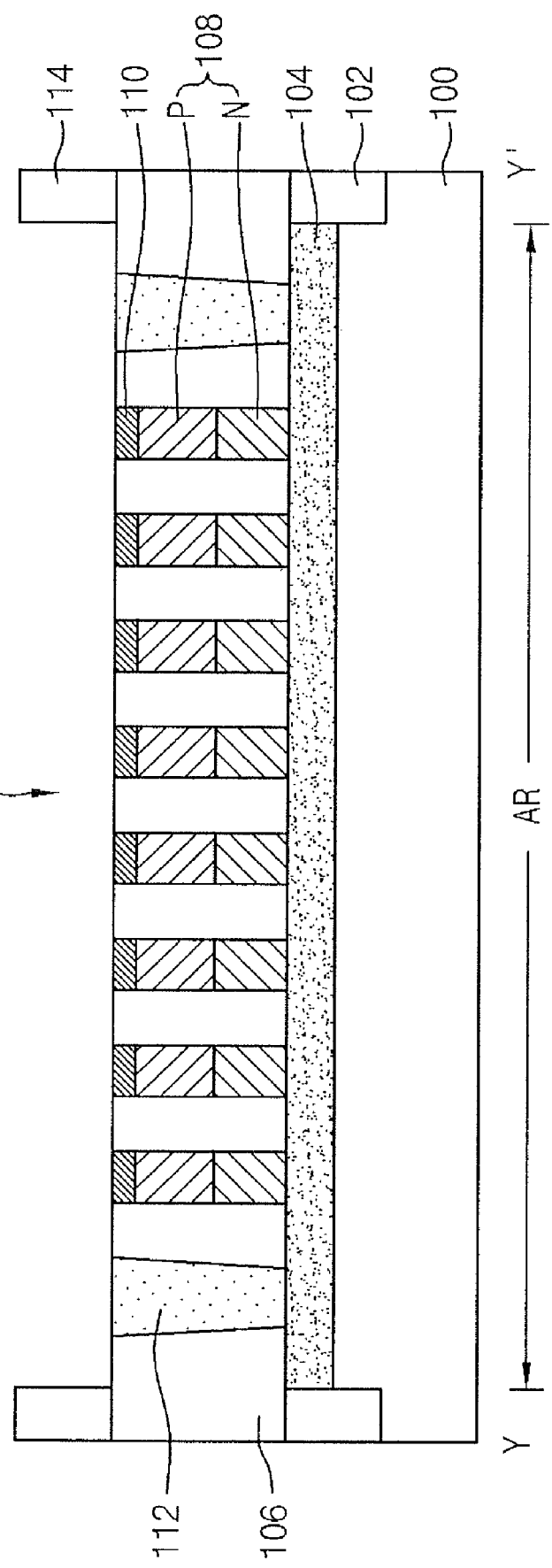

Referring to FIGS. 2D, 3D and 4D, after forming an insulation layer to cover the lower contact plugs 112 and the ohmic contact layer 110, by etching the insulation layer, an insulation layer pattern 114 is formed such that it has holes H each of which simultaneously exposes a portion of the first interlayer dielectric 106 present between adjoining cell active regions AR and portions of the respective adjoining cell active regions AR adjacent to the portion of the first interlayer dielectric 106. Therefore, portions of the ohmic contact layer 110 and lower contact plugs 112 in the cell active regions AR are exposed through the insulation layer pattern 114, and the dummy active region D/AR is covered by and is not exposed through the insulation layer pattern 114.

Figure 2E:
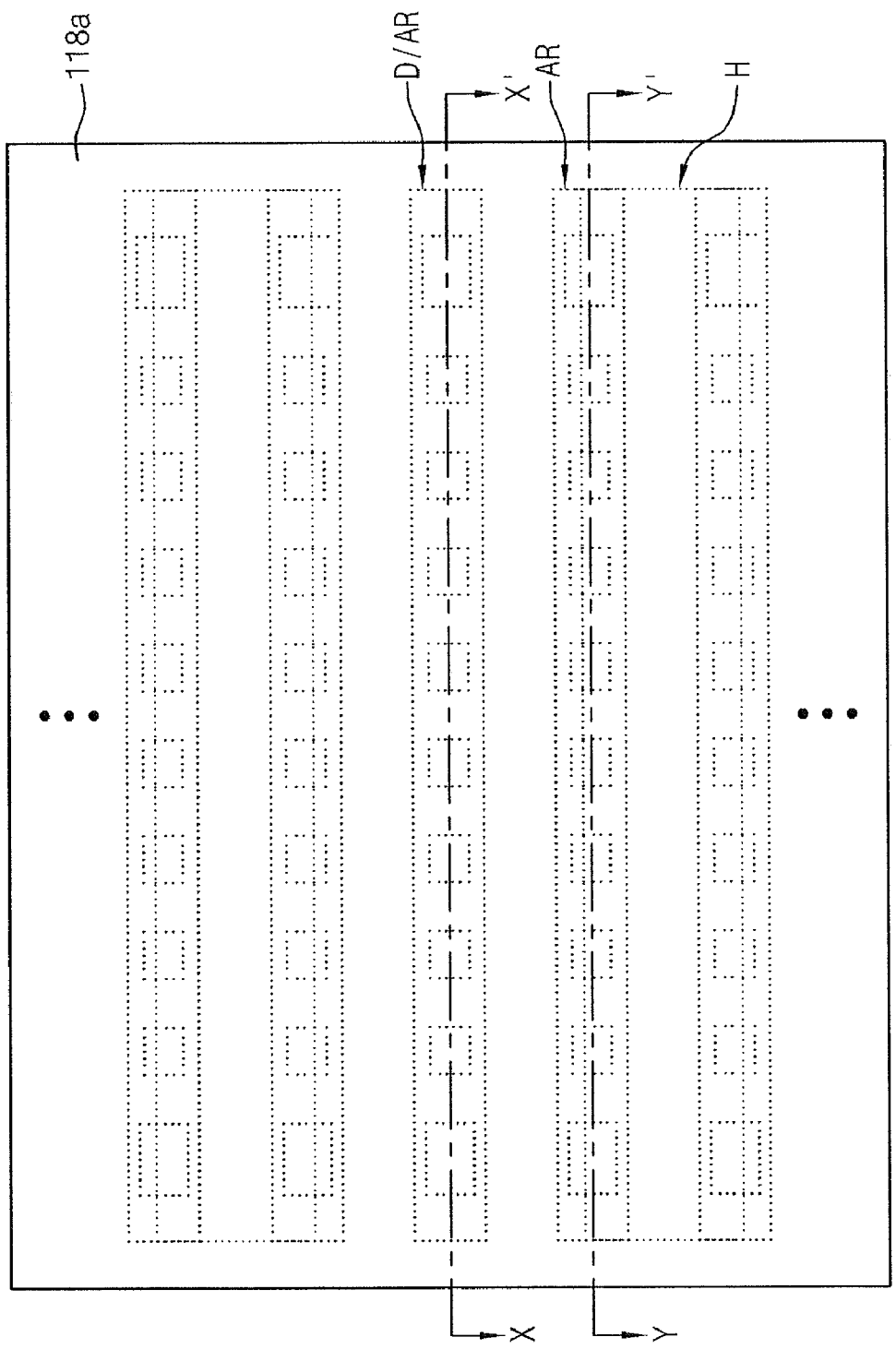
Figure 3E:
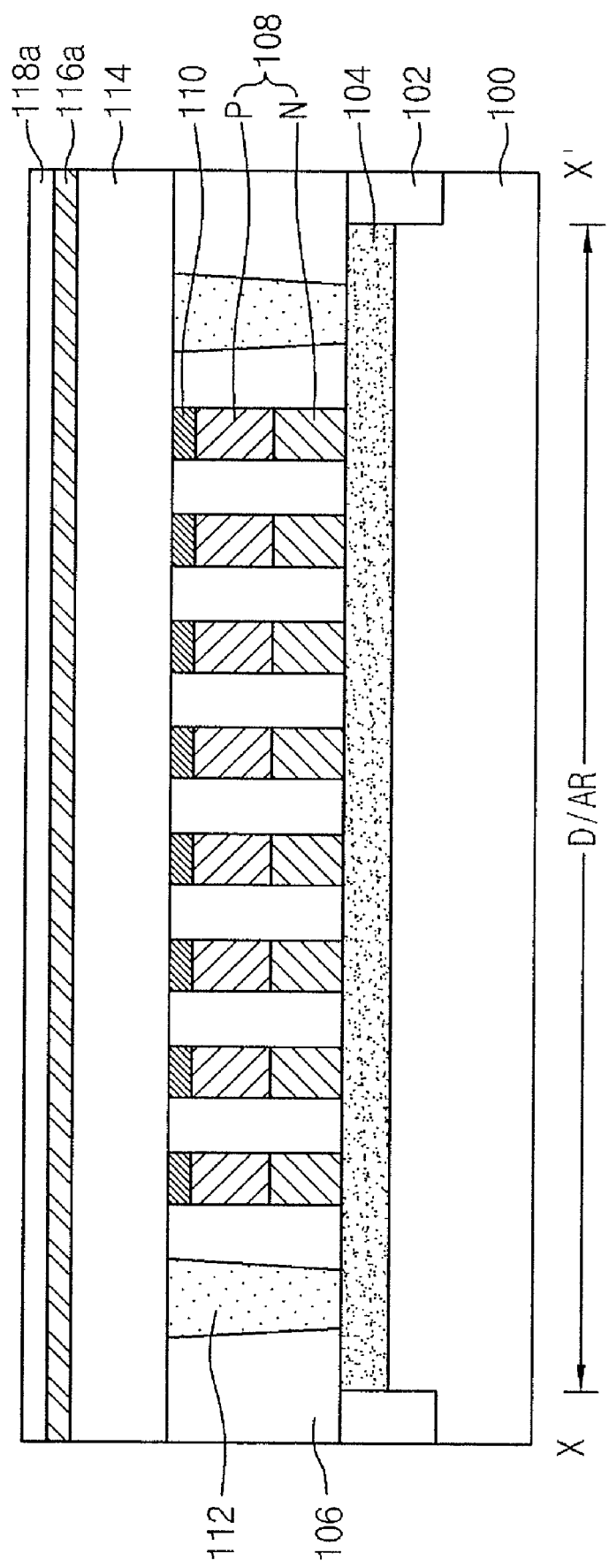
Figure 4E:
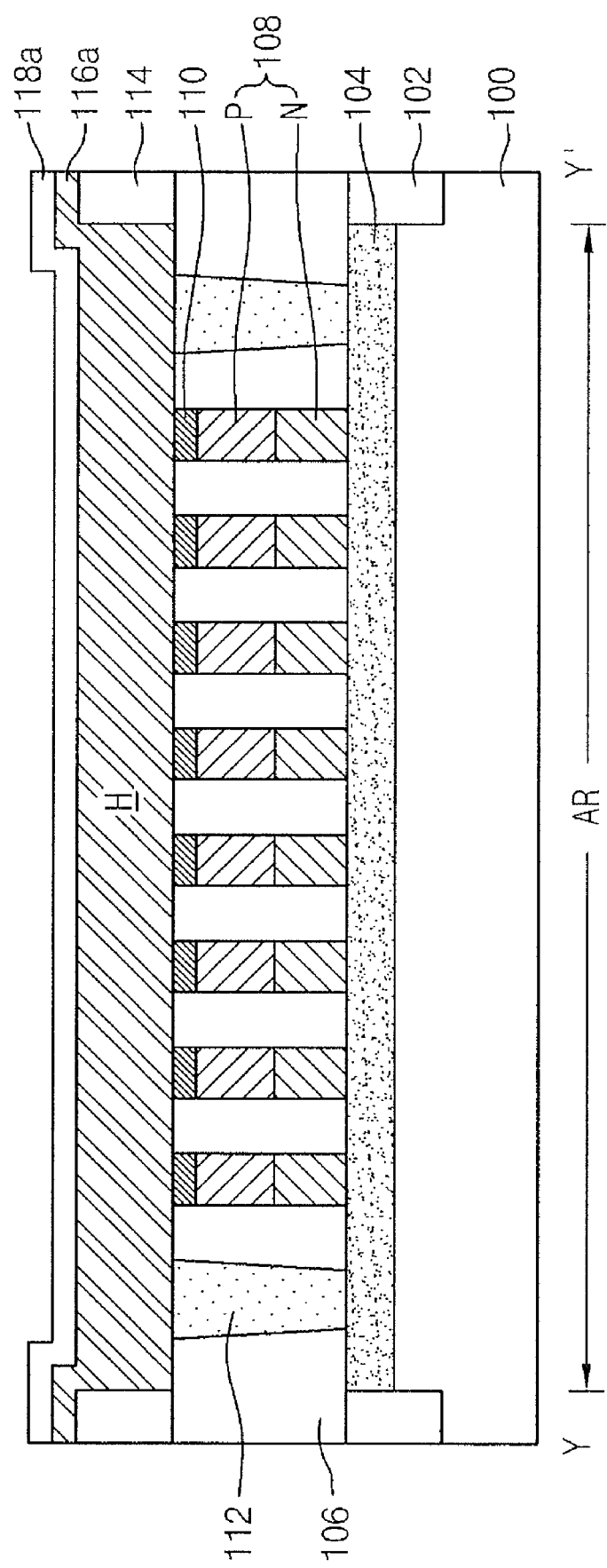

Referring to FIGS. 2E, 3E and 4E, a conductive layer 116a and a spacer layer 118a are sequentially formed on the insulation layer pattern 114 including the surfaces of the holes H along the profiles of the holes H. The conductive layer 116a comprises a metal-based layer, for example, the stack structure of Ti/TiN layers or Ti/TiSiN layers, and the spacer layer 118a comprises, for example, a nitride layer.

Figure 2F:
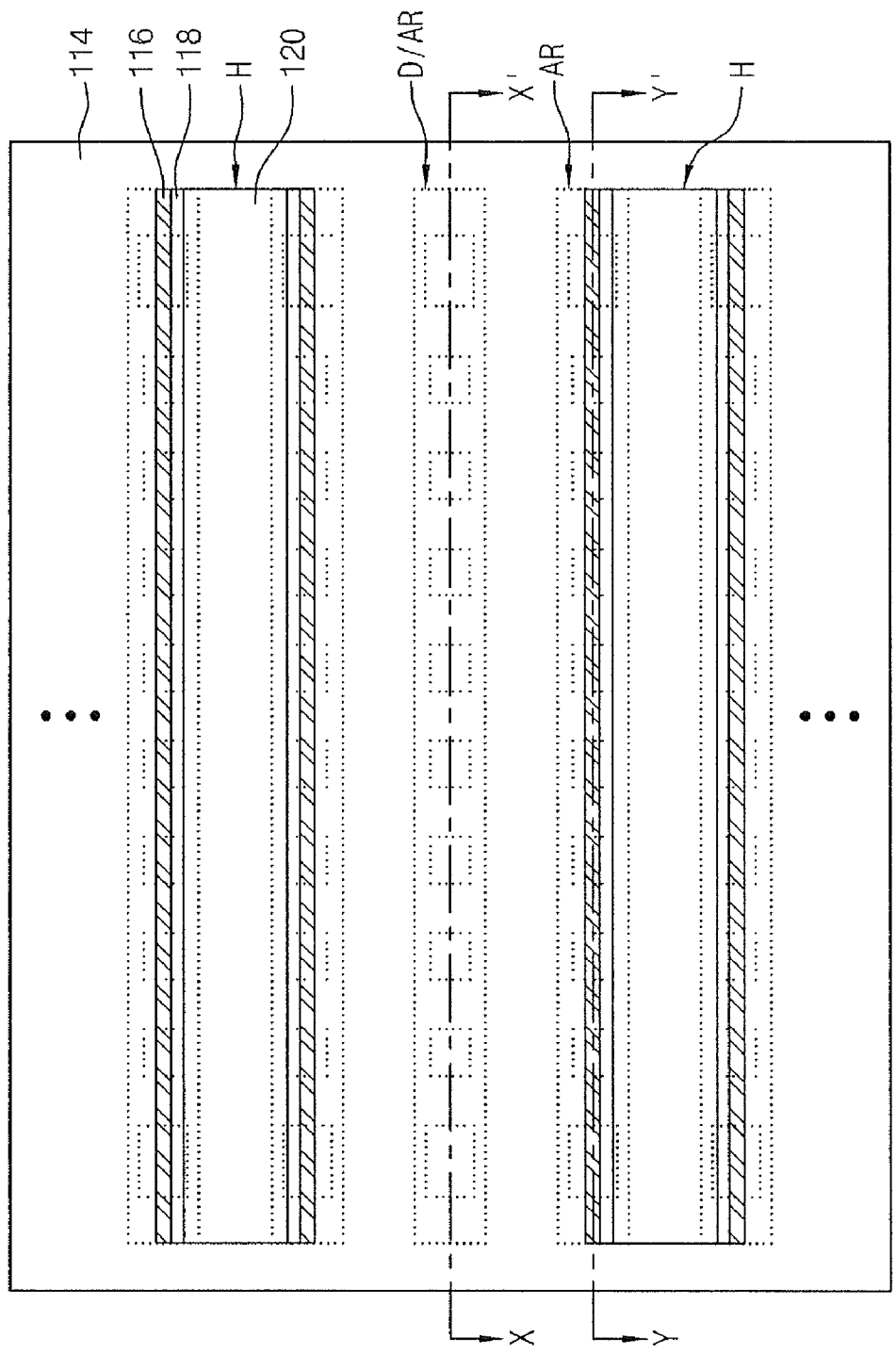
Figure 3F:
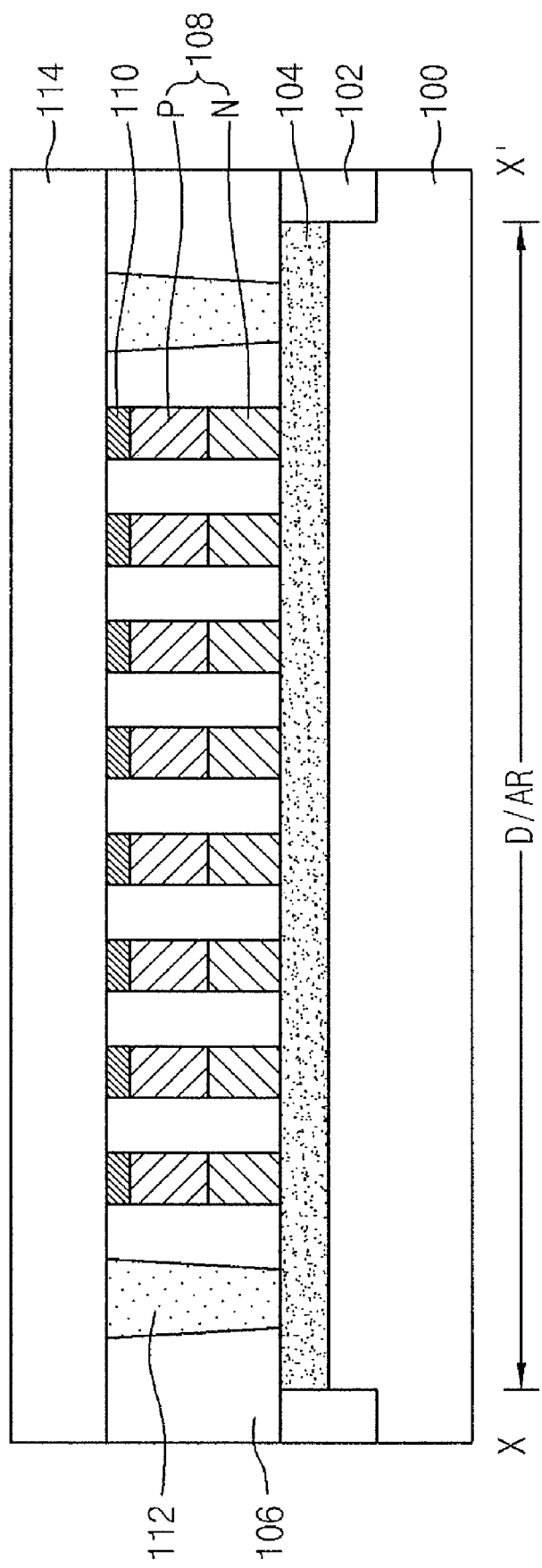
Figure 4F:
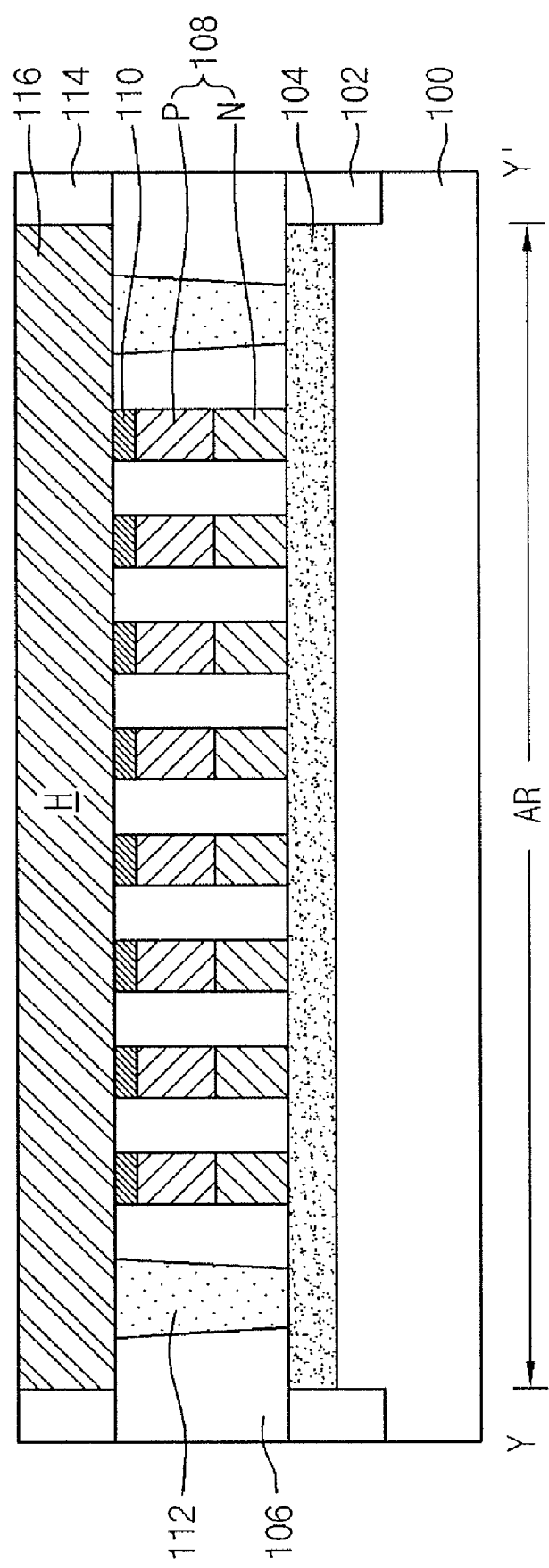

Referring to FIGS. 2F, 3F and 4F, by etching the spacer layer 118a and the conductive layer 116a, heaters 116 are formed in the holes H, preferably, on both sidewalls of the holes H, and spacers 118 are formed to cover the heaters 116. Since the holes H are defined to expose the portions of the respective adjoining cell active regions AR, the heaters 116 and the spacers 118 are selectively formed only in the cell active regions AR and are not formed in the dummy active region D/AR. Next, after forming a filler insulation layer 120 in such a way as to fill the holes H which have the heaters 116 and the spacers 118 on both sidewalls thereof, the filler insulation layer 120 is planarized until the upper surface of the insulation layer pattern 114 is exposed.

Referring to FIGS. 2G, 3G and 4G, a second interlayer dielectric 122 is formed on the resultant planarized semiconductor substrate 100. The second interlay dielectric 122 comprises, for example, a nitride layer. Then, by etching the second interlayer dielectric 122, contact holes CH are defined in the type of lines which extend in a direction perpendicular to the cell active regions AR and the dummy active region D/AR. The contact holes CH are defined in a manner such that, in the cell active regions AR, the heaters 116 and the spacers 118 are exposed, but, in the dummy active region D/AR, since the heaters 116 and the spacers 118 are not formed, only the insulation layer pattern 114 is exposed and the diodes 108 placed thereunder are not exposed.

Figure 3H:
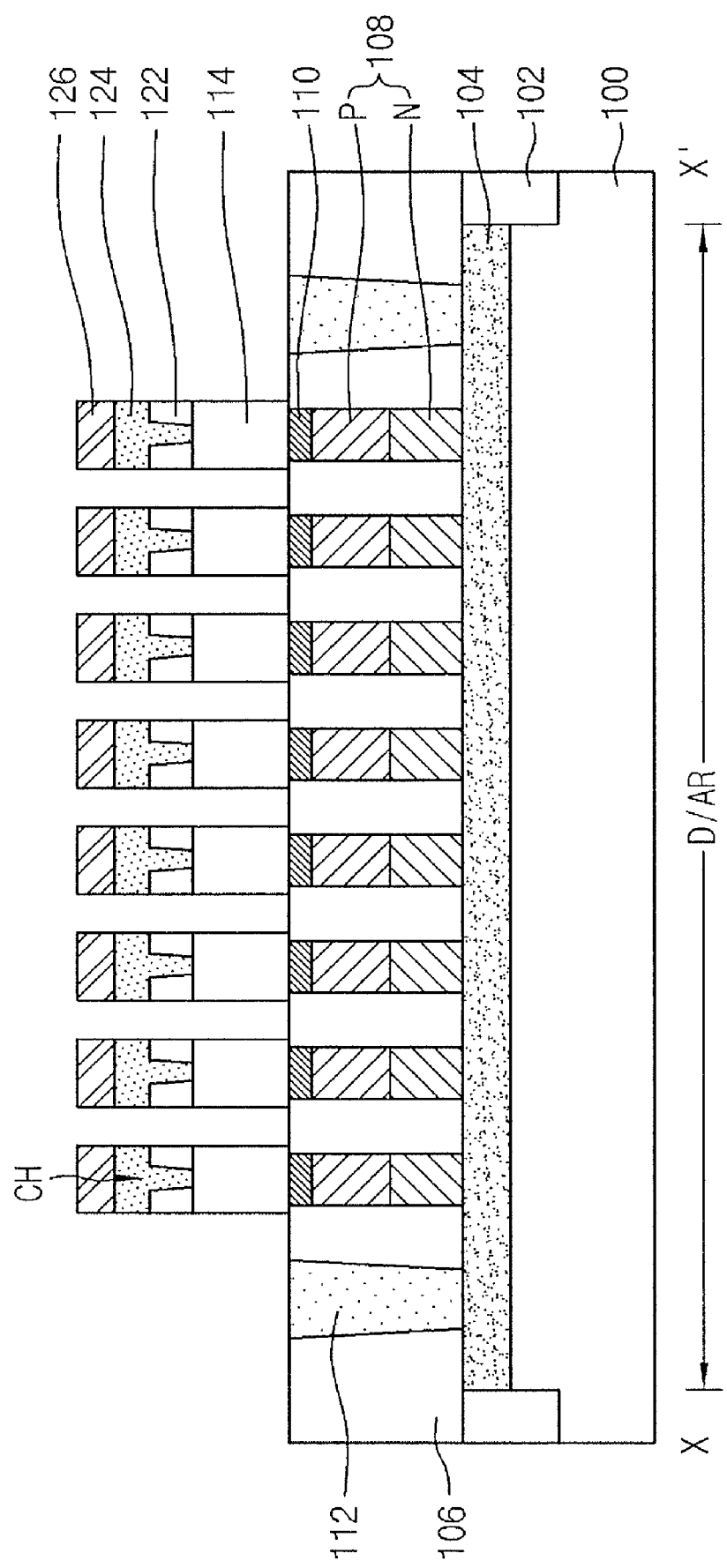
Figure 4H:
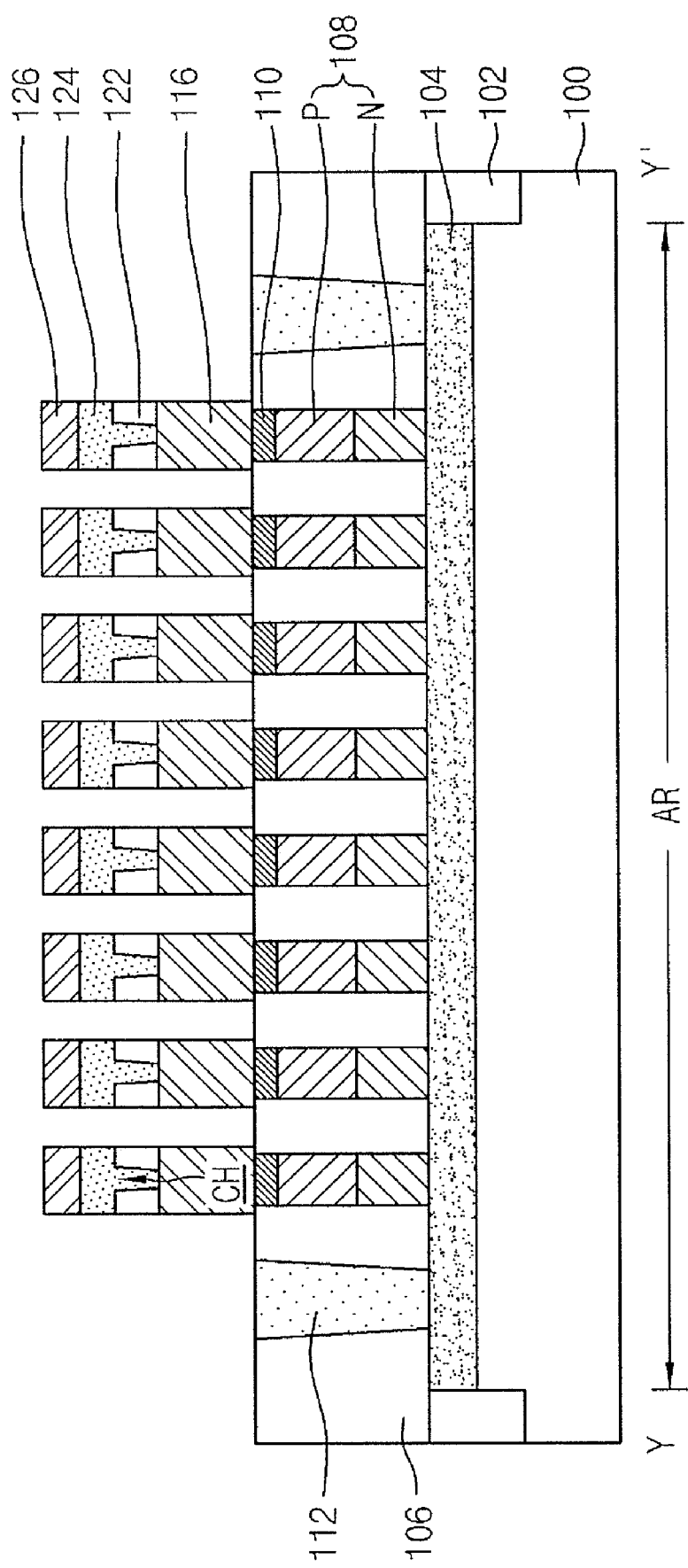

Referring to FIGS. 2H, 3H and 4H, a phase change material layer and a conductive layer for top electrodes are sequentially formed on the second interlayer dielectric 122 in such a way as to fill the contact holes CH. Thereupon, the phase change material layer, the conductive layer for top electrodes, the second interlayer dielectric 122, the heaters 116, and the insulation layer pattern 114 are patterned in the type of lines that extend in a direction parallel to the contact holes CH.

As a result, in the cell active regions AR, a phase change layer 124 and a top electrode 126 are sequentially formed on each heater 116 which contacts the ohmic contact layer 110 formed on each diode 108. In the dummy active region D/AR, a phase change layer 124 and a top electrode 126 are sequentially formed on the insulation layer pattern 114 which contacts the ohmic contact layer 110 formed on each diode 108. In other words, in the embodiment of the present invention, the phase change layer 124 formed in the dummy active region D/AR is not electrically connected with the diodes 108 formed in the dummy active region D/AR.

Figure 3I:
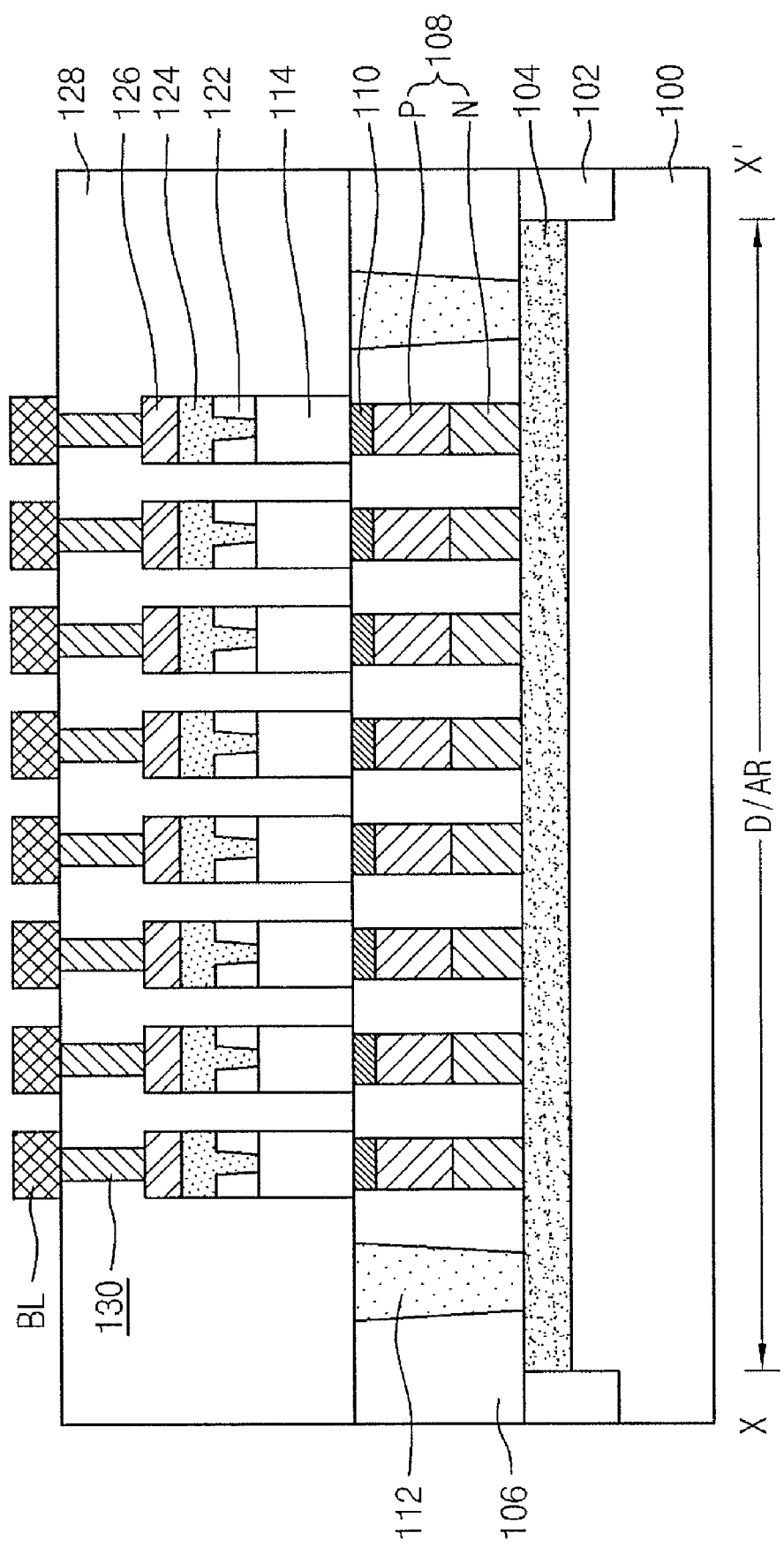
Figure 4I:
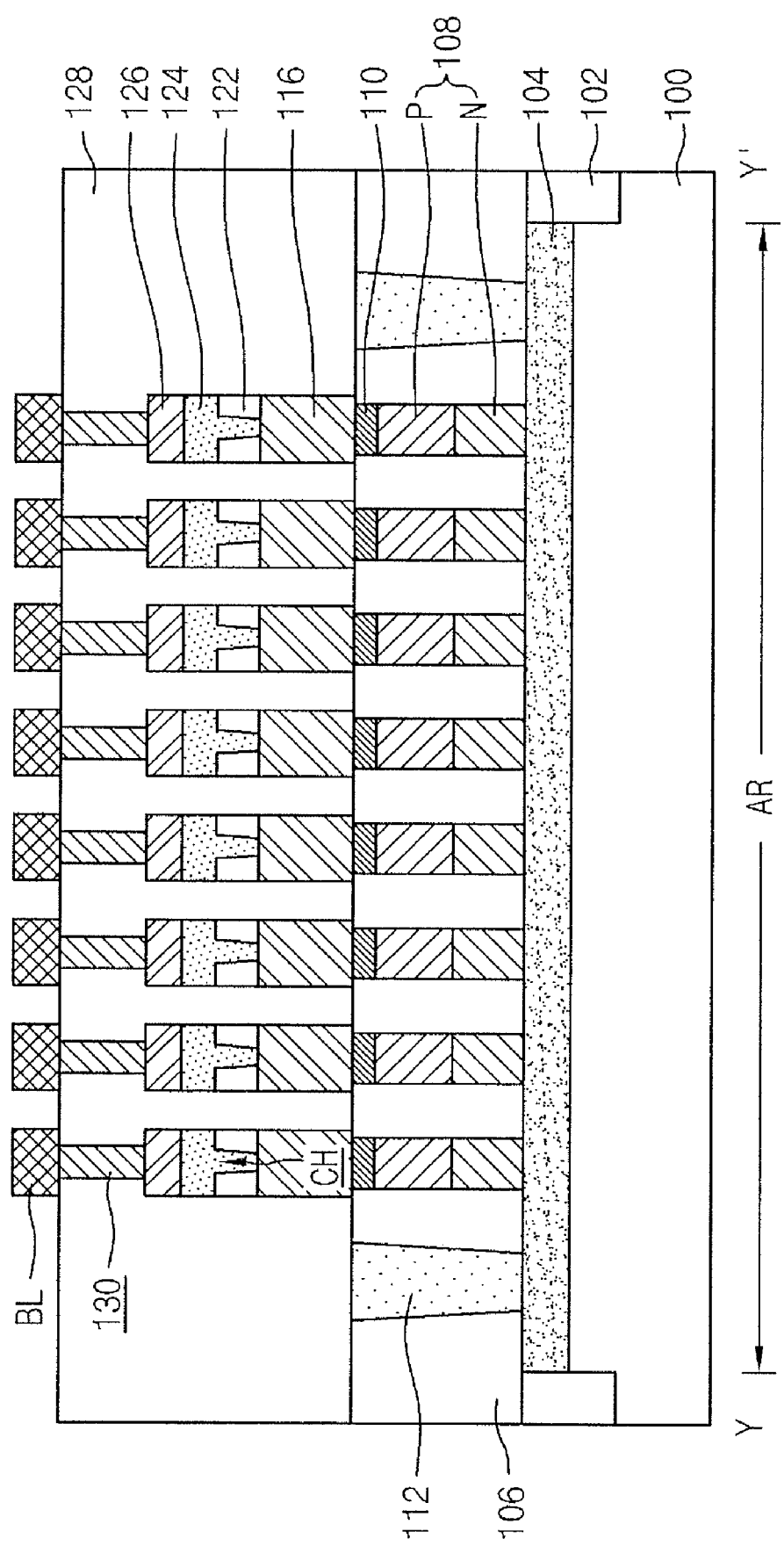

Referring to FIGS. 2I, 3I and 4I, a third interlayer dielectric 128 is formed on the resultant semiconductor substrate 100 that is formed with top electrodes 126, in such a way as to cover the top electrodes 126. Top electrode contacts 130 are formed in the third interlayer dielectric 128 in such a way as to contact the respective top electrodes 126. Then, bit lines BL are formed on the third interlayer dielectric 128 in such a way as to contact the top electrode contacts 130 and extend in a direction perpendicular to the cell active regions AR and the dummy active region D/AR.

In the embodiment of the present invention, in the cell active regions AR, cell memory strings are formed such that they are electrically connected with the N-type impurity regions 104 formed in the surfaces of the cell active regions AR and include the diodes 108, the heaters 116, the phase change layer 124, the top electrodes 126, the top electrode contacts 130 and the bit lines BL, whereas, in the dummy active region D/AR, a dummy cell string is formed such that it includes the diodes 108 without heaters 116, the phase change layer 124, the top electrodes 126, the top electrode contacts 130 and the bit lines BL and is not electrically connected with the N-type impurity region 104 formed in the surface of the dummy active region D/AR due to the insertion of the insulation layer pattern 114 between the diodes 108 and the phase change layer 124.

Figure 2J:
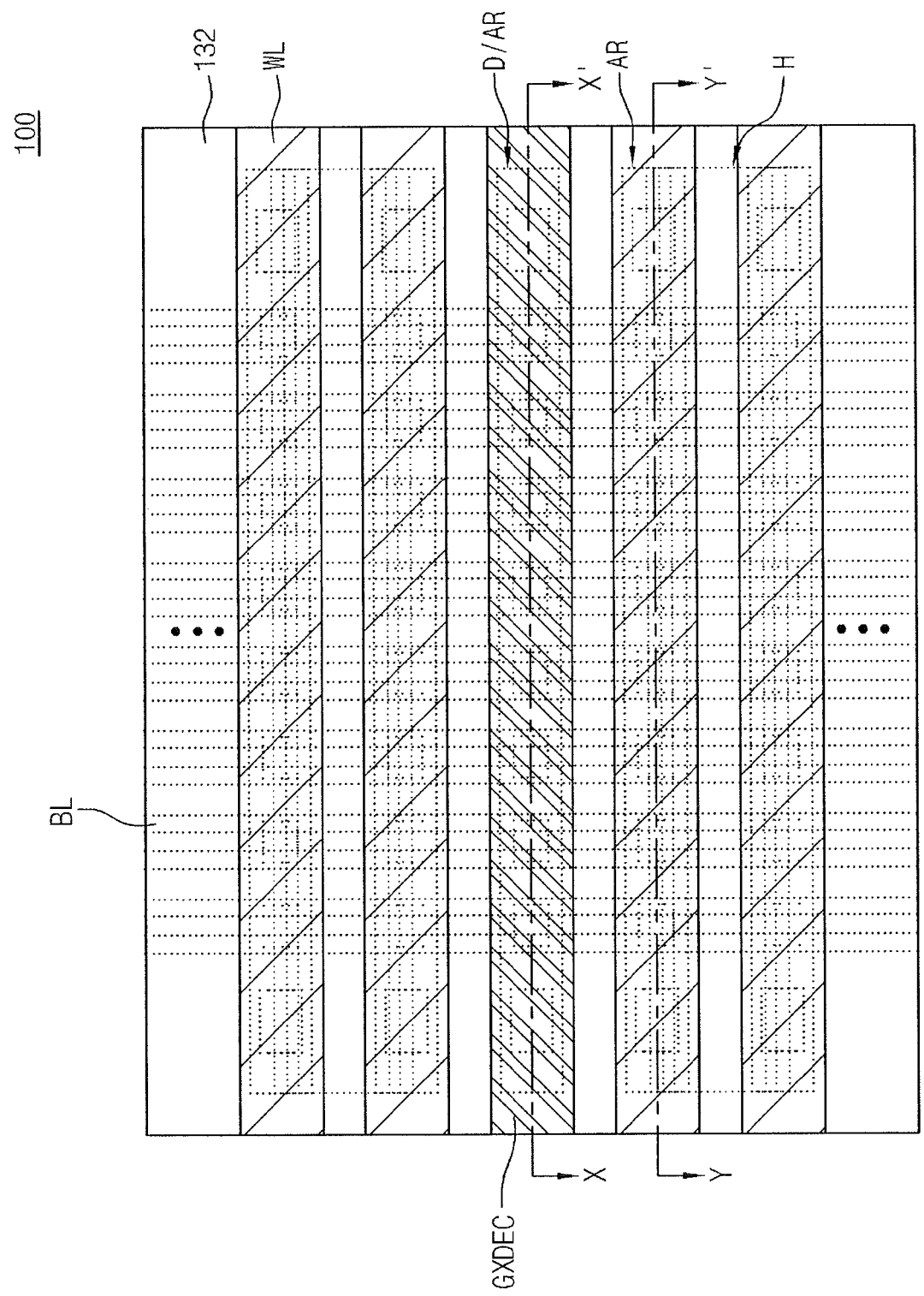
Figure 4J:
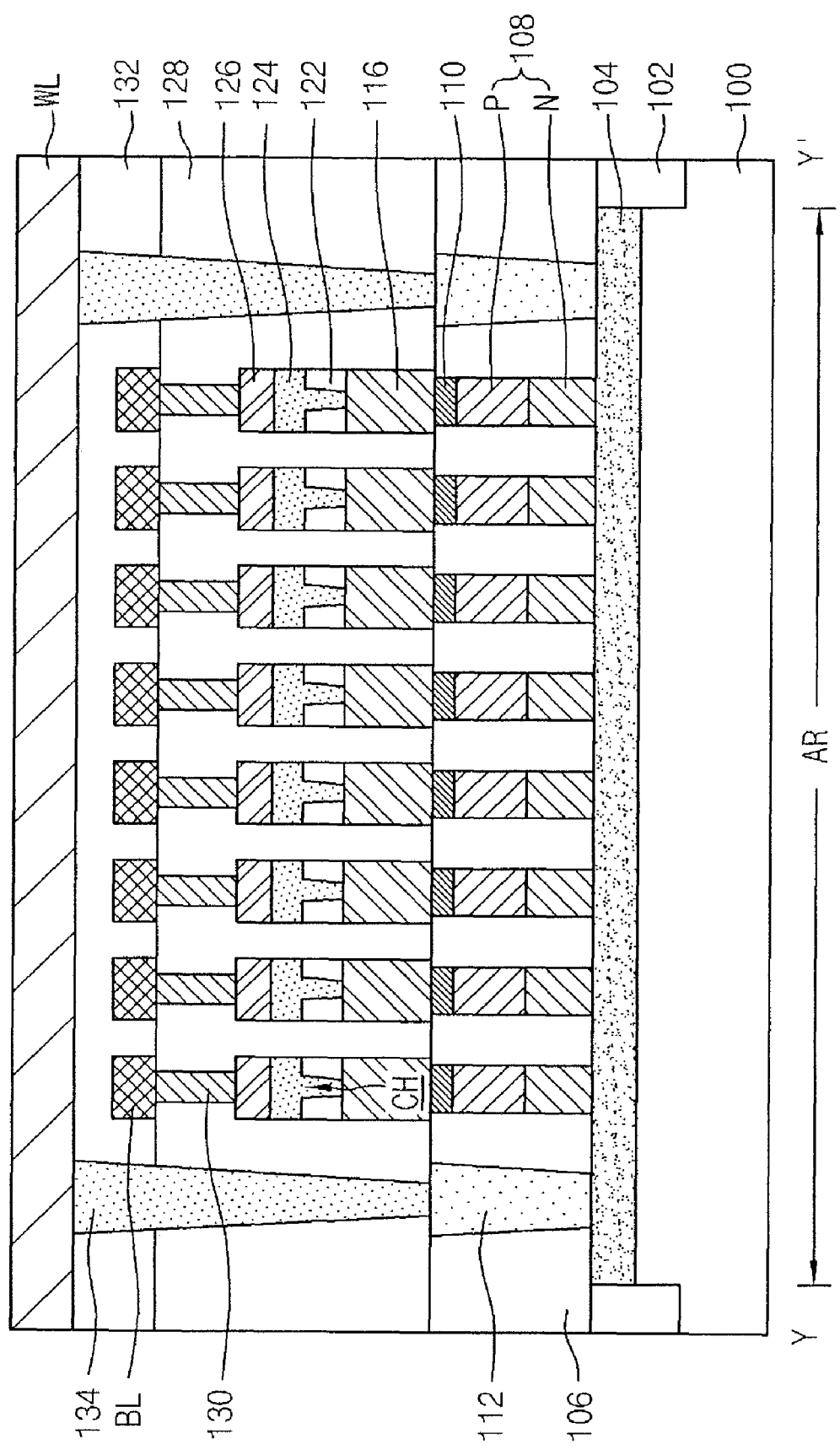

Referring to FIGS. 2J, 3J and 4J, a fourth interlayer dielectric 132 is formed on the third interlayer dielectric 128 in such is a way as to cover the bit lines BL. Next, upper contact plugs 134 are formed through the fourth and third interlayer dielectrics 132 and 128 in the cell active regions AR in such a way as to contact the lower contact plugs 112.

Thereafter, word lines WL are formed on the fourth interlayer dielectric 132 in the cell active regions AR in such a way as to contact the upper contact plugs 134 and extend in a direction perpendicular to the bit lines BL, and a global X-decoder line GXDEC is formed on the fourth interlayer dielectric 132 in the dummy active region D/AR in such a way as to extend in a direction parallel to the word lines WL.

Here, the word lines WL formed in the cell active regions AR are electrically connected with the N-type impurity regions 104, formed in the surfaces of the cell active regions AR, through the upper and lower contact plugs 134 and 112. Conversely, since only the lower contact plugs 112 are formed but the upper contact plugs 134 are not formed in the dummy active region D/AR, the global X-decoder line GXDEC formed in the dummy active region D/AR is not electrically connected with the N-type impurity region 104 formed in the surface of the dummy active region D/AR.

Thereafter, while not shown in a drawing, by sequentially conducting a series of well-known subsequent processes, the manufacture of a phase change memory device according to the embodiment of the present invention is completed.

As is apparent from the above description, in the embodiments of the present invention, by selectively defining holes for heaters only in cell active regions through the change of a lithography process, heaters which contact diodes can be selectively formed only in the cell active regions, and an insulation layer pattern can be formed on diodes in a dummy active region.

Accordingly, in the embodiments of the present invention, the present invention eliminates the need for a dummy cell string to be configured with heaters by inserting an insulation layer pattern between the diodes and a phase change layer in the dummy active region. Thus, in the present invention the electrical connection between the dummy cell string and the dummy active region is interrupted. Through this, in the embodiments of the present invention, when reading data in a phase change memory device, current flow from the bit line to the dummy active region can be suppressed even though a preset voltage (in general, a boosted voltage Vpp) is supplied to a selected bit line and the dummy active region under a global X-decoder line is in a grounded state (Vss). This current flow is suppressed because the dummy cell string and the dummy active region are not electrically connected with each other under the global X-decoder line, whereby parasitic current is prevented from being produced.

As a consequence, in the present invention, to prevent parasitic current is prevented from influencing the state of data when the phase change memory device changes a phase, whereby the sensing margin of the phase change memory device is effectively increased.

Also, in the embodiments of the present invention, because additional formation of dummy lines in the peripheral portions of a cell array are not necessary to prevent the production of parasitic current, the area of the cell array is decreased, and whereby improving cell efficiency.

Moreover, in the embodiments of the present invention, the electrical connection between the dummy cell string and the dummy active region can only be interrupted by changing a lithography process for defining holes for heaters without adding a separate process step. Accordingly, in the present invention, the manufacturing yield of a phase change memory device is prevented from decreasing.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a phase change memory device, comprising the steps of:
    forming a plurality of bar type cell active regions and a bar type dummy active region that is located between adjoining sets of cell active regions, in a semiconductor substrate;
    forming a plurality of diodes in the cell active regions and the dummy active region;
    forming an insulation layer pattern on the resultant semiconductor substrate that is formed with the diodes,
    wherein the insulation layer pattern has holes, and
    wherein each of the insulation layer pattern having holes simultaneously exposes a portion between adjoining cell active regions and portions of the respective adjoining cell active regions adjacent to the portion, and covers the dummy active region;
    forming heaters in the holes in such a way as to contact the diodes in the cell active regions;
    forming a phase change layer on the heaters in the cell active regions and on the insulation layer pattern in the dummy active region;
    forming bit lines over the phase change layer; and
    forming word lines over the bit lines in the cell active regions and a global X-decoder line over the bit lines in the dummy active region.

2. The method according to claim 1, wherein one dummy active region is located for every eight cell active regions.

3. The method according to claim 1, wherein, before the step of forming the diodes, the method further comprises the step of:
    forming N-type impurity regions in respective surfaces of the cell active regions and dummy active region.

4. The method according to claim 1, wherein a ground voltage is applied to the dummy active region.

5. The method according to claim 1, wherein the diodes comprise vertical PN diodes.

6. The method according to claim 1, wherein, after the step of forming the diodes and before the step of forming the insulation layer pattern, the method further comprises the step of:
    forming an ohmic contact layer on the diodes.

7. The method according to claim 1, wherein the heaters are formed on both sidewalls of the holes.

8. The method according to claim 1, wherein the phase change layer in the dummy active region is not electrically connected with the diodes in the dummy active region.

9. The method according to claim 1, wherein, after the step of forming the phase change layer and before the step of forming the bit lines, the method further comprises the step of:

forming top electrodes on the phase change layer.

10. The method according to claim 1, wherein the word lines are electrically connected with the cell active regions.

* * * * *